United States Patent
Okumoto et al.

(10) Patent No.: US 9,923,172 B2
(45) Date of Patent: *Mar. 20, 2018

(54) LIGHT-EMITTING DEVICE WITH TRANSPARENT SUBSTRATE

(71) Applicant: PANASONIC CORPORATION, Osaka (JP)

(72) Inventors: Kenji Okumoto, Osaka (JP); Yuji Tanaka, Osaka (JP)

(73) Assignee: PANASONIC CORPORATION, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/347,151

(22) Filed: Nov. 9, 2016

(65) Prior Publication Data

US 2017/0062766 A1 Mar. 2, 2017

Related U.S. Application Data

(63) Continuation of application No. 14/574,476, filed on Dec. 18, 2014, now Pat. No. 9,530,986.

(30) Foreign Application Priority Data

Jan. 14, 2014 (JP) ................................. 2014-004451
Jan. 14, 2014 (JP) ................................. 2014-004452

(51) Int. Cl.
| | |
|---|---|
| *H01L 27/15* | (2006.01) |
| *H01L 51/52* | (2006.01) |
| *H01L 27/12* | (2006.01) |
| *H01L 51/00* | (2006.01) |
| *H01L 21/683* | (2006.01) |

(52) U.S. Cl.
CPC ...... *H01L 51/5268* (2013.01); *H01L 21/6835* (2013.01); *H01L 27/1266* (2013.01);
(Continued)

(58) Field of Classification Search
CPC ............ H01L 51/5268; H01L 21/6835; H01L 51/003; H01L 51/0097; H01L 51/5253;
(Continued)

(56) References Cited

U.S. PATENT DOCUMENTS

| | | | |
|---|---|---|---|
| 7,030,555 B2 * | 4/2006 | Nakamura | .......... H01L 51/5036 313/504 |
| 7,410,883 B2 | 8/2008 | Gadkaree | |

(Continued)

FOREIGN PATENT DOCUMENTS

| | | |
|---|---|---|
| JP | 10-125929 | 5/1998 |
| JP | 2004-310056 | 11/2004 |

(Continued)

*Primary Examiner* — Vu A Vu
(74) *Attorney, Agent, or Firm* — Greenblum & Bernstein, P.L.C.

(57) ABSTRACT

A light-emitting device includes a transparent substrate having a first surface and a second surface opposite to the first surface. A light-emitting element is provided on the first surface of the transparent substrate and emits light. A porous layer is provided on the second surface of the transparent substrate, the porous layer including an organic material and having pores. The porous layer does not include an inorganic compound.

23 Claims, 28 Drawing Sheets

(52) U.S. Cl.
CPC ........ *H01L 51/003* (2013.01); *H01L 51/0097* (2013.01); *H01L 51/5253* (2013.01); *H01L 2221/6835* (2013.01); *H01L 2221/68381* (2013.01); *Y02E 10/549* (2013.01); *Y10T 428/249991* (2015.04)

(58) Field of Classification Search
CPC ......... H01L 27/1266; H01L 2221/6835; H01L 2221/68381; Y02E 10/549; Y10T 428/249991
USPC ............................................ 257/79; 313/503
See application file for complete search history.

(56) References Cited

U.S. PATENT DOCUMENTS

| | | | |
|---|---|---|---|
| 7,834,541 B2* | 11/2010 | Cok | B82Y 20/00 313/110 |
| 8,222,116 B2* | 7/2012 | Jinbo | H01L 27/1214 438/455 |
| 9,530,986 B2* | 12/2016 | Okumoto | H01L 51/003 |
| 2008/0212000 A1 | 9/2008 | French et al. | |
| 2009/0072733 A1 | 3/2009 | Funayama et al. | |
| 2010/0245717 A1 | 9/2010 | Miyamoto | |
| 2012/0274879 A1 | 11/2012 | Jinbo | |
| 2013/0049573 A1* | 2/2013 | Chien | H01L 51/5268 313/503 |

FOREIGN PATENT DOCUMENTS

| | | |
|---|---|---|
| JP | 2006-286616 | 10/2006 |
| JP | 2008-545999 | 12/2008 |
| JP | 2009-283155 | 12/2009 |
| JP | 2012-079594 | 4/2012 |
| JP | 2013-051430 | 3/2013 |
| JP | 2013-235276 | 11/2013 |

* cited by examiner

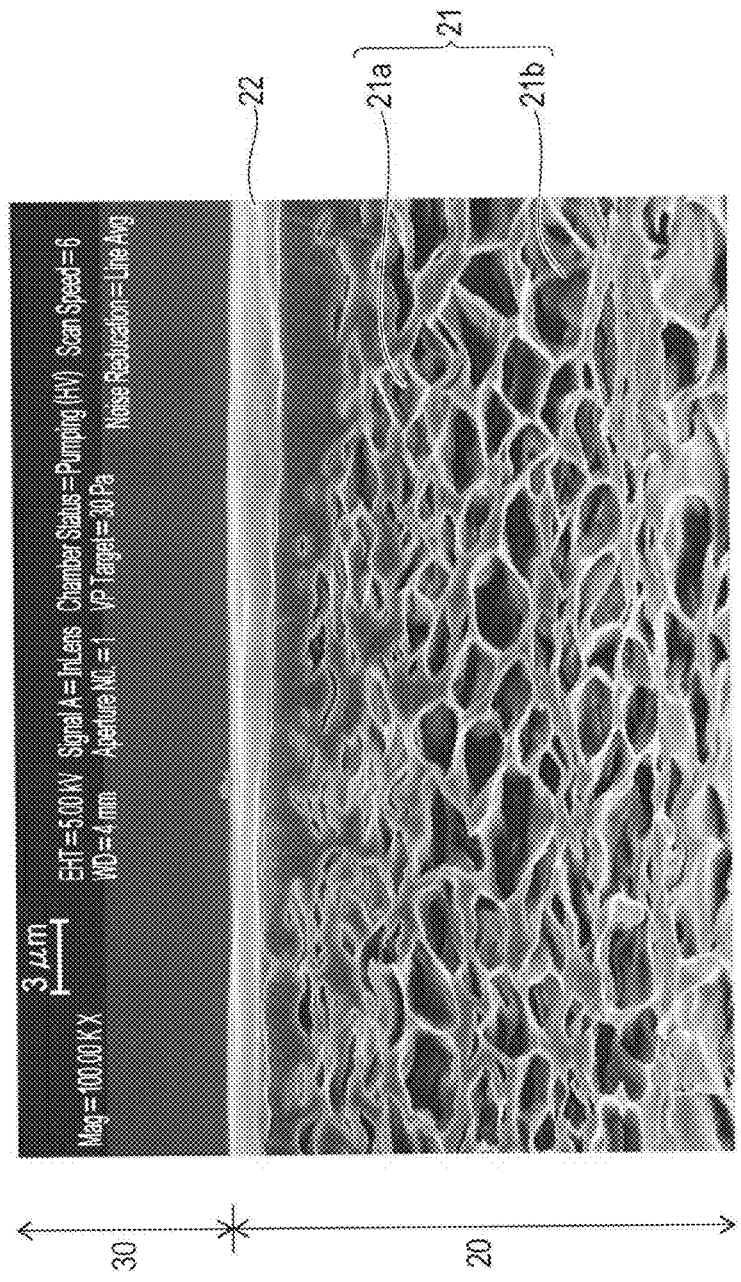

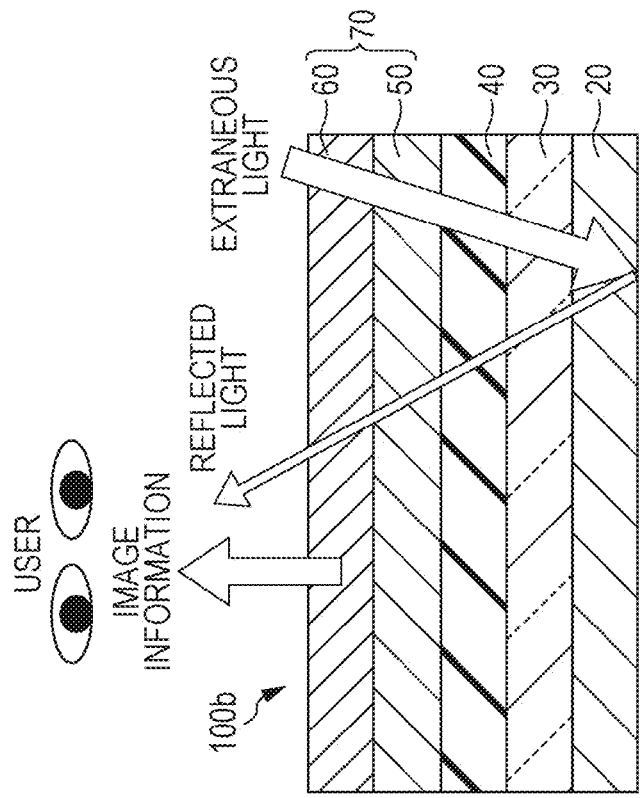
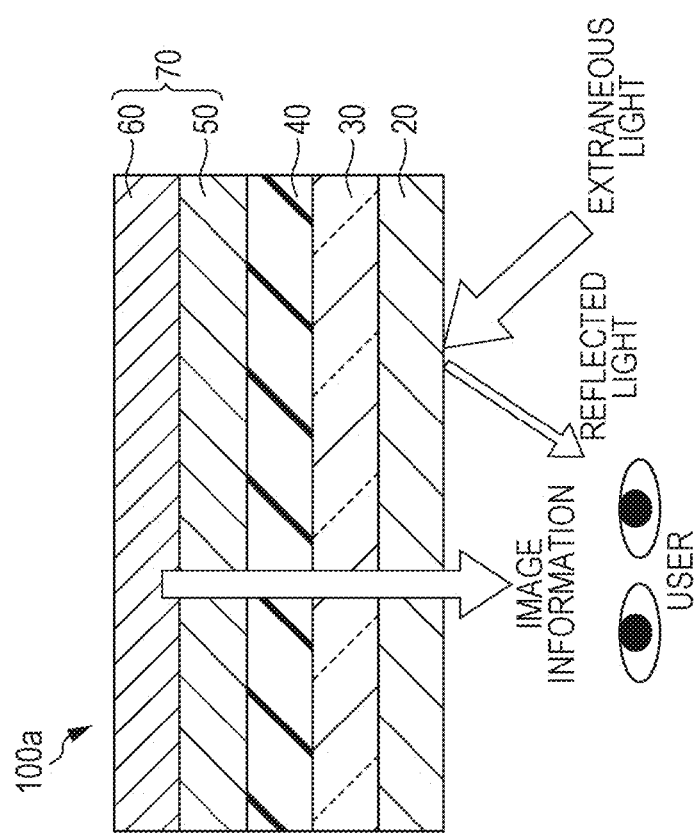

<u>1000</u>

FIG. 6A
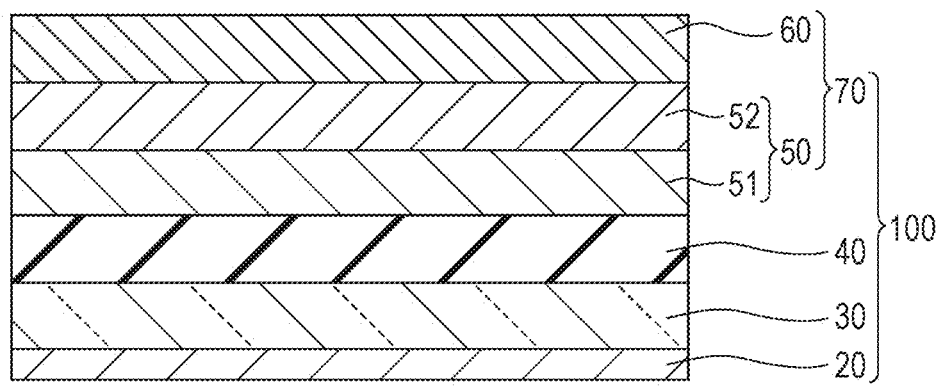
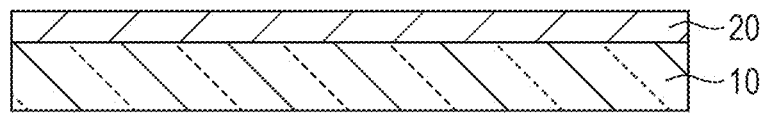
FIG. 6B
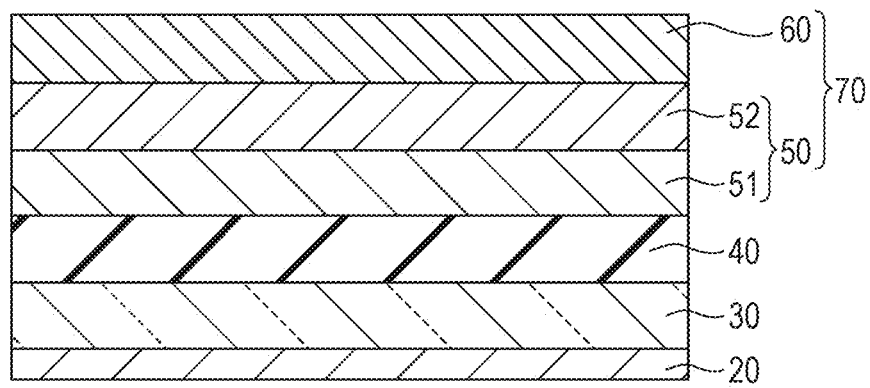

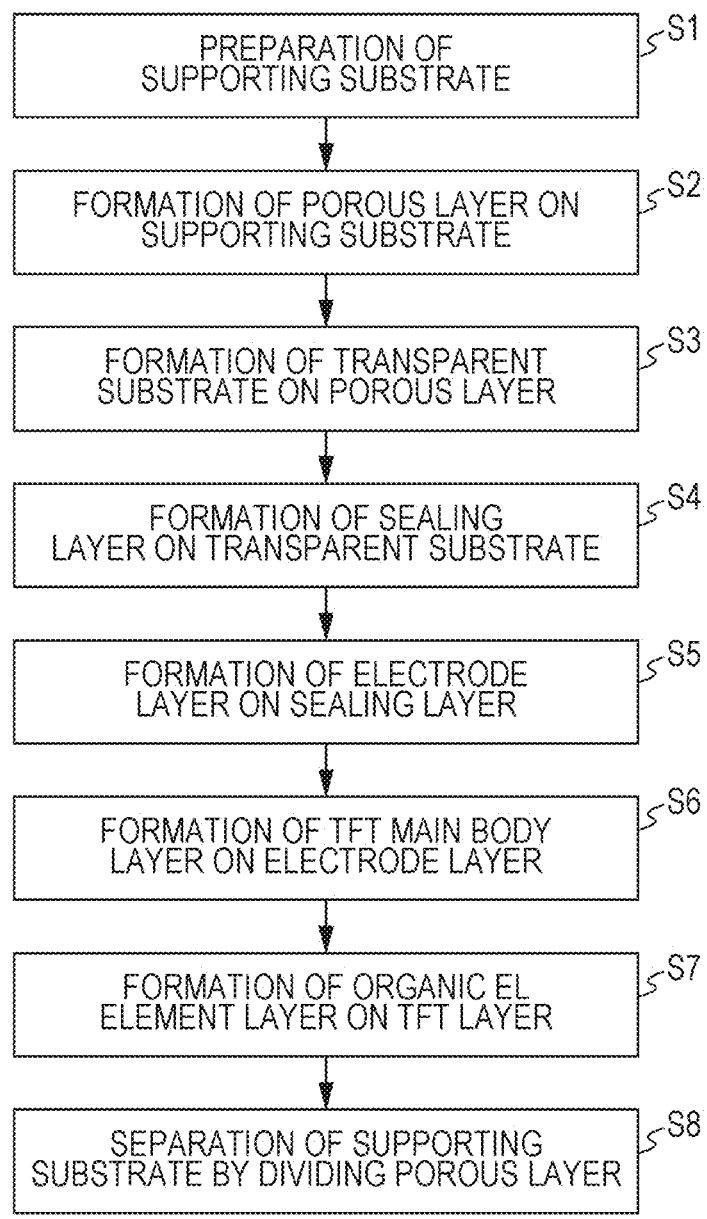

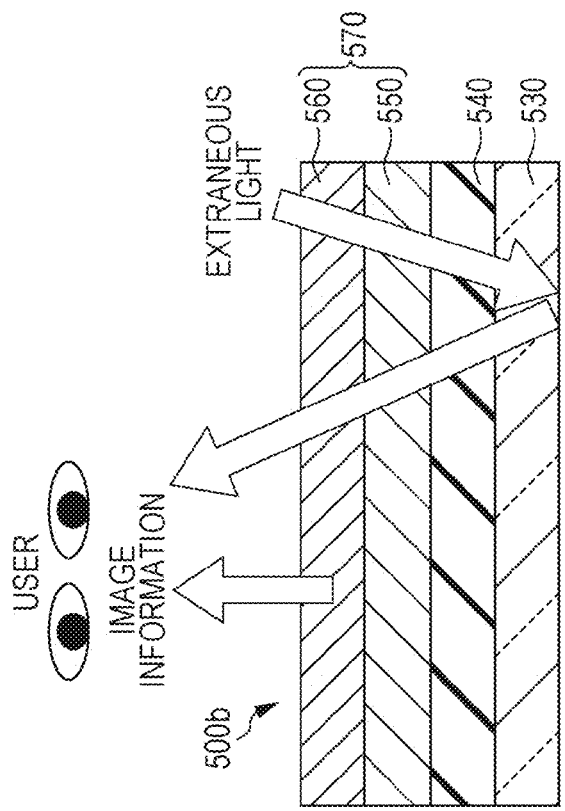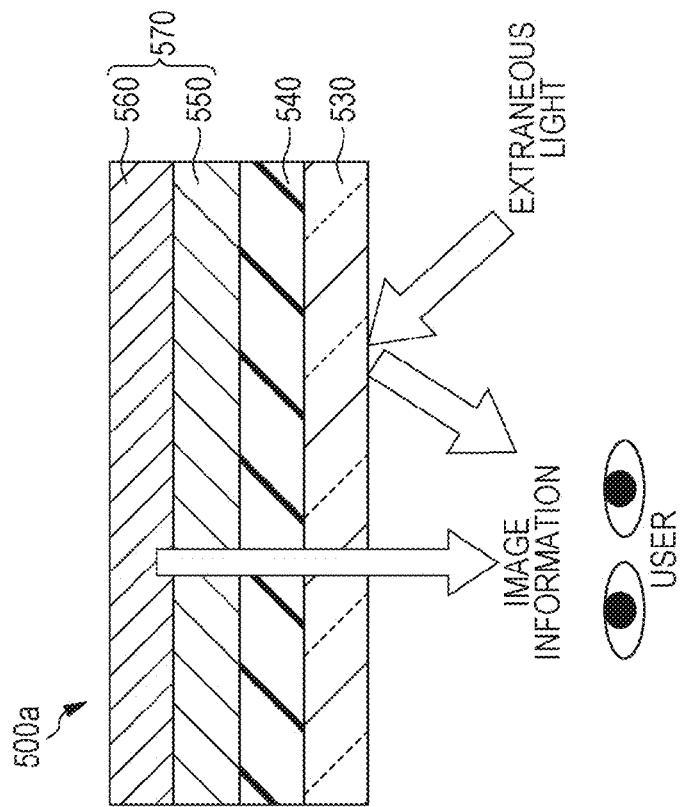

4000

4000

4000

FIG. 18A
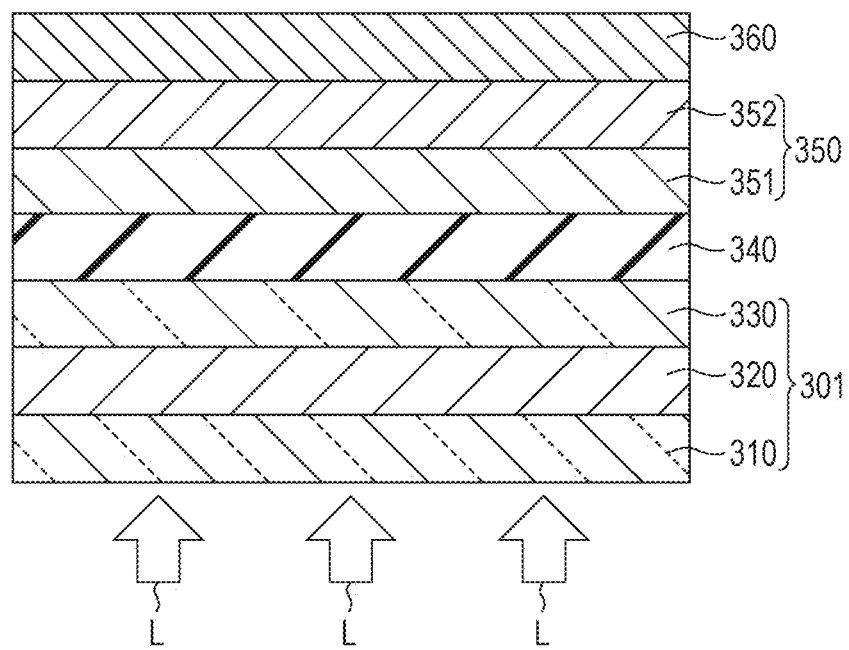
FIG. 18B
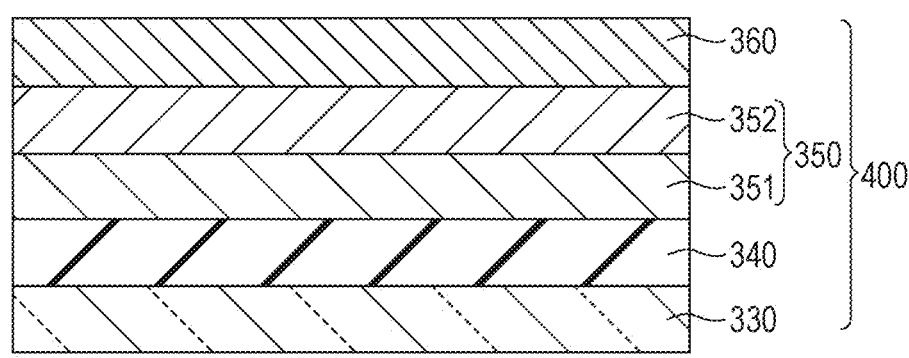

FIG. 21

| | | LASER IRRADIATION ENERGY DENSITY (mJ/cm²) | | | |
|---|---|---|---|---|---|
| | | 140 | 160 | 180 | 200 |
| TEST PIECE TP1 | SEPARATION | IMPOSSIBLE | POSSIBLE (5 TIMES) | POSSIBLE (2 TIMES) | POSSIBLE (1 TIME) |
| | ELECTRODE CRACKING | NO | NO | NO | NO |
| TEST PIECE TP2 | SEPARATION | IMPOSSIBLE | POSSIBLE (5 TIMES) | POSSIBLE (2 TIMES) | POSSIBLE (1 TIME) |
| | ELECTRODE CRACKING | NO | NO | NO | NO |
| TEST PIECE TP3 | SEPARATION | IMPOSSIBLE | POSSIBLE (20 TIMES) | POSSIBLE (5 TIMES) | POSSIBLE (2 TIMES) |
| | ELECTRODE CRACKING | NO | NO | YES | YES |

100 μm

TP1: POROUS LAYER 18μm

500μm

TP2: POROUS LAYER 117μm

500μm

TP3: WITHOUT POROUS LAYER

500μm

5000

3000

9000

9000

LIGHT-EMITTING DEVICE WITH TRANSPARENT SUBSTRATE

This application is a continuation of U.S. application Ser. No. 14/574,476, filed Dec. 18, 2014 and claims priority to Japanese Patent Application Nos. 2014-004451 and 2014-004452, filed on Jan. 14, 2014, the contents of which are hereby incorporated by reference.

BACKGROUND

1. Technical Field

The present disclosure relates to a laminated substrate, a light-emitting device, and a method for producing a light-emitting device.

2. Description of the Related Art

In general, display devices, such as liquid crystal displays (LCDs) and organic electroluminescence (EL) displays, have structures in which various layers, such as an electrode layer formed of a metal thin film, a thin film transistor (TFT) layer, an insulating layer, a light-emitting layer, a sealing layer configured to prevent the penetration of water or oxygen from the outside, a color filter, a polarizer, and a protective layer configured to prevent damage due to mechanical stress from the outside, are stacked on a substrate, for example, a glass substrate or a plastic substrate (for example, see Japanese Patent No. 4870156).

The formation of electronic device elements on plastic films (plastic substrates) results in electronic devices characterized by, for example, being lightweight, thin, rugged, and flexible. Such electronic devices are collectively referred to as flexible electronic devices. In recent years, the development of flexible electronic devices has been actively promoted. Examples of electronic devices include displays, photosensors, and radio-frequency identification tags (RFID tags).

Methods for producing such electronic devices including plastic substrates are broadly classified into three methods. A first method includes temporarily fixing a plastic film on a supporting glass substrate, forming an electronic device element, and then separating the supporting substrate. A second method includes forming an electronic device element on a plastic film without using a supporting substrate. A third method includes forming an electronic device element on a supporting substrate and then transferring the electronic device element to a plastic film.

In the second method, the electronic device element is directly formed on the film by, for example, a roll-to-roll process. The dimensions of the film are easily changed because of the absence of a supporting substrate. Thus, the second method has problems with the accuracy of dimensions in pattern processing and the accuracy of registration of patterns. In the third method, when the electronic device element formed on the supporting glass substrate is transferred to the plastic film, the plastic substrate that supports the electronic device element is temporarily not present under the electronic device element. Thus, the electronic device element is likely to break at the time of transfer because of its low mechanical strength. This occurs markedly at a wiring portion that should be arranged outside the plastic film in order to establish electrical connection. In the first method, a conventional apparatus for producing an electronic device can be used, thus suppressing investment in equipment. Moreover, the electronic device element is fixed on the supporting glass substrate in the production process, thus resulting in excellent dimensional stability during processing. After the separation of the supporting substrate composed of glass, the mechanical strength is maintained because of the presence of the plastic film. The first method has the advantage that the device can be easily produced.

In the case where an electronic device is produced by the first method, it is necessary to separate a supporting glass substrate after the formation of an electronic device element. In this case, however, a high-temperature heating step and so forth are performed in the process of forming the electronic device element after the temporary fixation of the plastic film on the supporting glass substrate. The plastic film and the supporting glass substrate are less likely to be easily separated from each other because of high adhesion between the plastic film and the supporting glass substrate.

To address this problem, Japanese Patent No. 4870156 discloses a method for separating a supporting glass substrate by cutting a contact portion of an interface between the supporting glass substrate and a plastic film with a laser.

To more stably performing the separation in the method for separating a supporting glass substrate with a laser disclosed in Japanese Patent No. 4870156, Japanese Patent No. 3809681 discloses a separation-promoting method in which an amorphous silicon layer is provided between a supporting glass substrate and a plastic substrate, and laser irradiation is performed to generate hydrogen gas from the amorphous silicon layer.

SUMMARY

One disclosed embodiment of the present disclosure provides a light-emitting device including a transparent substrate having a first surface and a second surface opposite to the first surface; a light-emitting element on the first surface of the transparent substrate that emits light; and a porous layer on the second surface of the transparent substrate, the porous layer including an organic material and having pores, wherein the porous layer does not include inorganic compound.

A comprehensive or specific embodiment may be provided using a member, a system, or a method, or by any combination of a member, a device, a system, and a method.

BRIEF DESCRIPTION OF THE DRAWINGS

FIG. 2 is a photomicrograph of a cross section of a porous layer and a transparent substrate in the display device according to the embodiment.

FIG. 3A schematically illustrates the state of reflection when the structure of the display device according to the embodiment is used for a display device having a bottom-emission structure. FIG. 3B schematically illustrates the state of reflection when the structure of the display device according to the embodiment is used for a display device having a top-emission structure.

FIG. 4A is a partial cross-sectional view of a supporting substrate. FIG. 4B is a partial cross-sectional view of a state in which a porous layer is formed on the supporting substrate. FIG. 4C is a partial cross-sectional view of a state in which a transparent substrate is formed on the porous layer. FIG. 4D is a partial cross-sectional view of a state in which a sealing layer is formed on the transparent substrate.

FIG. 5A is a partial cross-sectional view of a state in which an electrode layer is formed on the sealing layer. FIG. 5B is a partial cross-sectional view of a state in which a thin-film transistor (TFT) main body layer is formed on the electrode layer. FIG. 5C is a partial cross-sectional view of a state in which an organic electroluminescent (EL) element layer is formed on the TFT main body layer.

FIGS. 6A and 6B are partial cross-sectional views schematically illustrating some steps in the procedure for producing the display device continued from FIG. 5C. FIG. 6A is a schematic, partial cross-sectional view of the supporting substrate and the display device in a state in which the porous layer is broken to separate the supporting substrate. FIG. 6B is a partial cross-sectional view schematically illustrating a state in which the display device according to the embodiment is completed.

FIG. 7 is a schematic flow chart of the procedure for producing the display device according to the embodiment.

FIG. 9A is a partial cross-sectional view schematically illustrating a state in which a first porous sublayer is formed on a supporting substrate. FIG. 9B is a partial cross-sectional view schematically illustrating a state in which a second porous sublayer is formed on the first porous sublayer. FIG. 9C is a partial cross-sectional view schematically illustrating a state in which a transparent substrate is formed on the second porous sublayer. FIG. 9D is a partial cross-sectional view of the porous layer and the transparent substrate after the separation of the supporting substrate.

FIG. 10A is a partial cross-sectional view schematically illustrating a state in which a porous layer is formed on a supporting substrate. FIG. 10B is a partial cross-sectional view schematically illustrating a state in which a thin film is formed on the porous layer.

FIG. 11A is a partial cross-sectional view schematically illustrating a state in which the thin film is irradiated with ultraviolet (UV) light. FIG. 11B is a partial cross-sectional view schematically illustrating the state of the thin film after the UV irradiation. FIG. 11C is a partial cross-sectional view schematically illustrating a state in which a transparent substrate is formed on the thin film after the UV irradiation.

FIG. 13A schematically illustrates the state of reflection from a display device having a bottom-emission structure not according to an embodiment of the present disclosure.

FIG. 13B schematically illustrates the state of reflection from a display device having a top-emission structure not according to an embodiment of the present disclosure.

FIG. 16A is a partial cross-sectional view of the supporting substrate. FIG. 16B is a partial cross-sectional view of a state in which the porous layer is formed on the supporting substrate. FIG. 16C is a partial cross-sectional view of a state in which the plastic substrate is formed on the porous layer. FIG. 16D is a partial cross-sectional view of a state in which a sealing layer is formed on the plastic substrate.

FIG. 17A is a partial cross-sectional view of a state in which an electrode layer is formed on the sealing layer. FIG. 17B is a partial cross-sectional view of a state in which a TFT main body layer is formed on the electrode layer. FIG. 17C is a partial cross-sectional view of a state in which an organic EL element layer is formed on the TFT main body layer.

FIGS. 18A and 18B are partial cross-sectional views schematically illustrating some steps in the procedure for producing the electronic device continued from FIG. 17C. FIG. 18A is a partial cross-sectional view schematically illustrating a state in which the electronic device and the supporting substrate are irradiated with laser light before the separation of the supporting substrate. FIG. 18B is a partial cross-sectional view schematically illustrating the state of the supporting substrate and the electronic device after the separation.

FIG. 21 illustrates the results of the evaluation of the effect of suppressing damage from laser irradiation by a method for producing an electronic device according to the embodiment on damage suppression.

FIG. 26A is a partial cross-sectional view schematically illustrating a state in which a porous layer is formed on a supporting substrate. FIG. 26B is a partial cross-sectional view schematically illustrating a state in which a thin film is formed on the porous layer.

FIG. 27A is a partial cross-sectional view schematically illustrating a state in which the thin film is irradiated with UV light. FIG. 27B is a partial cross-sectional view schematically illustrating the state of the thin film after the UV irradiation. FIG. 27C is a partial cross-sectional view schematically illustrating a state in which a plastic substrate is formed on the thin film after the UV irradiation.

DETAILED DESCRIPTION

Underlying Knowledge Forming Basis of the Present Disclosure

In display devices, extraneous light (for example, light from fluorescent lamps inside a building, and sunlight outside buildings) is reflected from screens, i.e., surfaces of displays, and observed as reflected images. This disadvantageously causes users to have difficulty in visually identifying display images on display surfaces. Moreover, in display devices having laminated structures, the problem with reflection can be caused by the structures in addition to the reflection of extraneous light from display surfaces. That is, extraneous light that enters display devices from display surfaces is reflected from interfaces between layers or reflected from front or back surfaces of one or more layers to emerge from display surfaces. The degree of reflection of light depends on the angle of incidence and a difference in refractive index between substances located both sides of the interfaces. Typically, a greater difference in refractive index results in a high degree of reflection. Thus, a higher degree of reflection is obtained at the interface between a solid layer and air, rather than the interface between solid layers, such as a resin layer and a glass layer. Therefore, in general, the reflection of light from the front and back surfaces, which are outermost surfaces, of a laminate is closely related to the problem with reflection.

Figure 12:
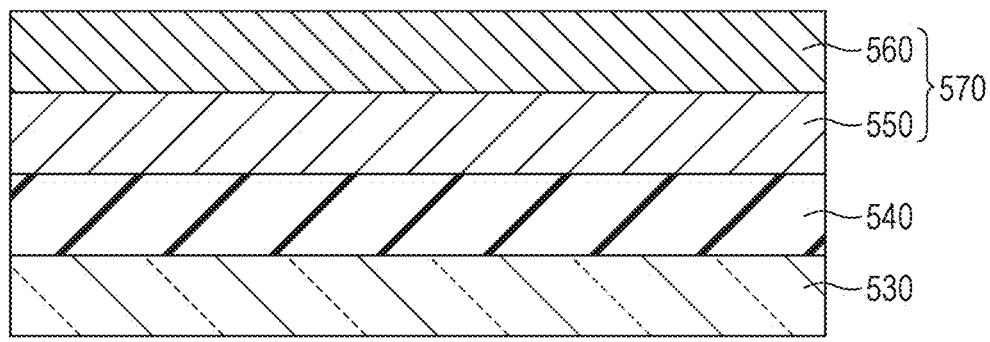
FIG. 12 is a schematic, partial cross-sectional view of the structure of a display device not according to an embodiment of the present disclosure.

FIG. 12 is a partial cross-sectional view schematically illustrating the structure of a display device 500 serving as an organic EL display device as a display device not according to an embodiment of the present disclosure. FIG. 13A schematically illustrates the state of formation of reflected images when the structure of the display device 500 is used for a display device 500a having a bottom-emission structure. FIG. 13B schematically illustrates the state of formation of reflected images when the structure of the display device 500 is used for a display device 500b having a top-emission structure.

As illustrated in FIG. 12, the display device 500 includes a sealing layer 540, a TFT layer 550, and an organic EL element layer 560 stacked, in that order, on a transparent substrate 530. The transparent substrate 530 is composed of a resin, such as an acrylic resin, or glass which transmits light. An interlayer insulating layer, a protective layer, and so forth may be arranged between the layers. A color filter, a sealing layer, a protective layer, and so forth may be arranged on the organic EL element layer 560. The TFT layer 550 and the organic EL element layer 560 constitute a display device element layer 570.

As illustrated in FIG. 13A, the display device 500a, not according to an embodiment of the present disclosure, has a bottom-emission structure. In the case of the display device 500a, extraneous light is reflected from a surface of the transparent substrate 530. The reflected light enters the eyes of a user together with light that expresses image information, thereby forming reflected images. As illustrated in FIG. 13B, the display device 500b, not according to an embodiment of the present disclosure, has a top-emission structure. In the case of the display device 500b, part of extraneous light that enters the display device 500b from the organic EL element layer 560 is transmitted through the organic EL element layer 560, the TFT layer 550, the sealing layer 540, and the transparent substrate 530 to reach the back surface of the transparent substrate 530. Then, the light is reflected from the back surface. The reflected extraneous light is again transmitted through the transparent substrate 530, the sealing layer 540, the TFT layer 550, and the organic EL element layer 560 to enter the eyes of a user together with light that expresses image information, thereby forming reflected images. A main surface adjacent to a user is referred to as a "front surface". A main surface remote from a user is referred to as a "back surface". In the case of the display device 500b, some components of light that enters the display device 500b are reflected from the interfaces among the organic EL element layer 560, the TFT layer 550, the sealing layer 540, and the transparent substrate 530. Other components of the light are reflected and absorbed by, for example, electrodes (not illustrated) and wiring (not illustrated) in the organic EL element layer 560 and the TFT layer 550. The reflection and absorption occur for incident light and outgoing light. Thus, reflected light that forms reflected images is generally weak, compared with the case of the display device 500a. Even in the case of the display device 500b, however, the reflection and absorption may be less likely to occur, depending on the angle of incidence of extraneous light and a region of a display surface on which extraneous light is incident. As a result, strong reflected images may be formed, in some cases. Conventional light-emitting devices also have this reflection problem.

Accordingly, the inventors have conducted intensive studies in order to provide a light-emitting device having satisfactory visibility by suppressing reflection.

A light-emitting device according to an aspect of the present disclosure includes a transparent substrate, a light-emitting element arranged on or above one main surface of the transparent substrate, and a porous layer arranged on or above the other main surface of the transparent substrate, the porous layer being an organic material layer having a plurality of pores.

The porous layer is arranged on the main surface of the transparent substrate opposite to the side on which a light-emitting element lies. Thus, in the case where the light-emitting device has a bottom-emission structure, extraneous light incident on a front surface of the light-emitting device, i.e., a main surface of the transparent substrate opposite to the side on which the light-emitting element lies, is scattered by the porous layer, thereby suppressing reflection. In the case where the light-emitting device has a top-emission structure, extraneous light that enters the light-emitting device from a front surface of the light-emitting device is scattered by the porous layer at the back surface serving as a main surface of the transparent substrate opposite to the side on which the light-emitting element lies. This suppresses the formation of reflected images due to the fact that extraneous light that enters the light-emitting device is reflected from the back surface of the transparent substrate and emerges from the front surface of the light-emitting device.

The porous layer is formed of the organic material layer. Thus, unlike porous inorganic material or inorganic particles, the following effects are provided: The porous layer is formed of the organic material layer, thus resulting in excellent flexibility. The organic material layer is easily curved at a low load. Thus, stress on the device element is low upon applying a flexural load, so that the device element is less likely to be damaged. Moreover, the porous layer is formed of the organic material layer. It is thus possible to cushion an impact from the outside to prevent the device from being damaged. Furthermore, since the porous layer is formed of the organic material layer, for example, in the case where the device element is separated from the supporting substrate by laser irradiation during production, heat generated by the laser irradiation is less likely to diffuse into the surroundings. Thus, the influence of heat on the device element is inhibited, and the energy of the laser is efficiently used to process the inorganic material layer. In addition, the porous layer is formed of the organic material layer and thus has heat insulation, so that it is possible to reduce the influence of external heat on the device element. As the organic material layer, a porous polyimide film may be used.

The porous layer may not contain inorganic particles.

Inner surfaces of some pores among the plurality of pores may be exposed at a main surface of the porous layer opposite to a side on which the transparent substrate lies. A gas may be present in the pores the inner surfaces of which are exposed.

In this case, when the light-emitting device has a bottom-emission structure, the main surface of the porous layer opposite to the side on which the transparent substrate lies serves as a display surface. The irregularities formed by the exposure of the inner surfaces of some pores in the porous layer are present on the display surface. This scatters extraneous light at the display surface to suppress reflection. In addition, since extraneous light is scattered at the display surface, the entrance of extraneous light into the light-emitting device is inhibited. This suppresses the formation of reflected images due to the fact that extraneous light that enters the light-emitting device is reflected from the inside of the light-emitting device and emerges from the display surface, thereby enhancing the effect of suppressing the formation of reflected images.

The average diameter of the pores in a portion of the porous layer adjacent to the transparent substrate may be smaller than the average diameter of the pores in a portion of the porous layer opposite to a side on which the transparent substrate lies.

In this case, when the light-emitting device has a top-emission structure, a higher degree of scattering of incident light occurs in a region further away from the display surface, thereby suppressing the effect of scattered light on display images.

In the porous layer, the average diameter of the pores in a first porous sublayer portion of the porous layer may be smaller than the average diameter of the pores in a second porous sublayer portion of the porous layer, the first porous sublayer portion including a main surface of the porous layer opposite to a side on which the transparent substrate lies, and the second porous sublayer portion being located at a position nearer the transparent substrate than the first porous sublayer portion.

In the case where the light-emitting device has a bottom-emission structure, the inner surfaces of some pores in the porous layer are exposed at the display surface to form irregularities. The average diameter of the pores in the first porous sublayer portion is smaller, thus resulting in smaller irregularities. This inhibits the degradation of the impression of the appearance and images to be displayed. Even in the case of a touch-screen light-emitting device, it is possible to provide a smooth operational feeling because of small irregularities on the surface of the touch screen.

The light-emitting element may emit light to display an image toward the transparent substrate, in which the porous layer may be composed of a material that transmits light.

In this case, when the light-emitting device according to an aspect of the present disclosure is used for a light-emitting device having a bottom-emission structure, light that expresses image information is transmitted through the porous layer to reach the eyes of a user. The porous layer scatters extraneous light to suppress the formation of reflected images.

The porous layer may not contain inorganic particles.

A laminated substrate according to another aspect of the present disclosure includes a supporting substrate, a porous layer arranged on or above the supporting substrate, the porous layer being an organic material layer and containing a plurality of pores in at least part of a region of the porous layer, the plurality of pores containing internal spaces, and a gas being present in the internal spaces, and a resin substrate arranged on or above a main surface of the porous layer opposite to a side on which the supporting substrate lies.

In the structure of the laminated substrate according to another embodiment of the present disclosure, the at least part of the region of the porous layer contains the plurality of pores having internal spaces, so that the porous layer has lower stiffness than that of the resin substrate. For example, after an electronic device element and its component are partially formed, the supporting substrate is separated by irradiation with laser light from the supporting substrate side. In this case, the energy of the pressure of a gas possibly generated from the resin substrate at the time of the laser light irradiation is consumed to break the porous layer. This reduces stress on the resin substrate and suppresses the deformation of the resin substrate, thus suppressing damage to the electronic device element and so forth formed above the resin substrate.

The porous layer may not contain inorganic particles.

A method for producing a light-emitting device according to another aspect of the present disclosure includes preparing a supporting substrate, forming a porous layer on or above the supporting substrate, the porous layer being formed of an organic material layer and containing a plurality of pores, forming a transparent substrate on the porous layer, forming a light-emitting element on or above the transparent substrate, breaking the porous layer at a portion inside the porous layer or an interface between the supporting substrate and the porous layer, and separating the supporting substrate from the transparent substrate while at least part of the broken porous layer is attached to the transparent substrate.

In the method for producing a light-emitting device according to the another aspect of the present disclosure, the porous layer is formed on a main surface of the transparent substrate opposite to the side on which the light-emitting element lies. The at least part of the porous layer is attached to the main surface of the transparent substrate opposite to the side on which the light-emitting element lies. Thus, in the case where the light-emitting device has a bottom-emission structure, a front surface of the light-emitting device, i.e., a main surface of the transparent substrate opposite to the side on which the light-emitting element lies, is scattered by the porous layer, thereby suppressing reflection. In the case where the light-emitting device has a top-emission structure, extraneous light that enters the light-emitting device from a front surface of the light-emitting device is scattered by the porous layer at the back surface serving as a main surface of the transparent substrate opposite to the side on which the light-emitting element lies. This suppresses the formation of reflected images due to the fact that extraneous light that enters the light-emitting device is reflected from the back surface of the transparent substrate and emerges from the front surface of the light-emitting device.

The porous layer is formed of the organic material layer. Thus, unlike porous inorganic material or inorganic particles, the following effects are provided: The porous layer is formed of the organic material layer, thus resulting in excellent flexibility. The organic material layer is easily curved at a low load. Thus, stress on the device element is low upon applying a flexural load, so that the device element is less likely to be damaged. Moreover, the porous layer is formed of the organic material layer. It is thus possible to cushion an impact from the outside to prevent the device from being damaged. Furthermore, since the porous layer is formed of the organic material layer, for example, in the case where the device element is separated from the supporting substrate by laser irradiation during production, heat generated by the laser irradiation is less likely to diffuse into the surroundings. Thus, the influence of heat on the device element is inhibited, and the energy of the laser is efficiently used to process the inorganic material layer. In addition, the porous layer is formed of the organic material layer and thus has heat insulation, so that it is possible to reduce the influence of external heat on the device element. As the organic material layer, a porous polyimide film may be used.

The porous layer may not contain inorganic particles.

The break of the porous layer may be performed by irradiating the porous layer with laser light from the supporting substrate side.

Thereby, it is possible to easily separate the supporting substrate with laser light.

The break of the porous layer may be performed by applying mechanical stress to the porous layer.

Thereby, it is possible to easily separate the supporting substrate with a roller or the like.

Some inner surfaces of the plurality of pores may be exposed at a main surface of the broken porous layer opposite to a side on which the transparent substrate lies. A gas may be present in the pores the inner surfaces of which are exposed.

In this case, when the light-emitting device has a bottom-emission structure, the main surface of the porous layer opposite to the side on which the transparent substrate lies serves as a display surface. The irregularities formed by the exposure of the inner surfaces of some pores in the porous layer are present on the display surface. This scatters extraneous light at the display surface to suppress reflection. In addition, since extraneous light is scattered at the display surface, the entrance of extraneous light into the light-emitting device is inhibited. This suppresses the formation of reflected images due to the fact that extraneous light that enters the light-emitting device is reflected from the inside of the light-emitting device and emerges from the display surface, thereby enhancing the effect of suppressing the formation of reflected images.

The average diameter of the pores in a portion of the porous layer adjacent to the transparent substrate may be smaller than the average diameter of the pores in a portion of the porous layer opposite to a side on which the transparent substrate lies.

In this case, when the light-emitting device has a top-emission structure, a higher degree of scattering of incident light occurs in a region further away from the display surface, thereby suppressing the effect of scattered light on display images.

The average diameter of the pores in a first porous sublayer portion of the porous layer may be smaller than the average diameter of the pores in a second porous sublayer portion of the porous layer, the first porous sublayer portion including a main surface of the porous layer opposite to a side on which the transparent substrate lies, and the second porous sublayer portion being located at a position nearer the transparent substrate than the first porous sublayer portion.

In the case where the light-emitting device has a bottom-emission structure, the inner surfaces of some pores in the porous layer are exposed at the display surface to form irregularities. The average diameter of the pores in the first porous sublayer portion is smaller, thus resulting in smaller irregularities. This inhibits the degradation of the impression of the appearance and images to be displayed. Even in the case of a touch-screen light-emitting device, it is possible to provide a smooth operational feeling because of small irregularities on the surface of the touch screen.

The porous layer may contain the plurality of pores in at least part of a region of the porous layer, the plurality of pores containing internal spaces, and a gas being present in the internal spaces. The transparent substrate may be a resin substrate. The supporting substrate may be separated from the resin substrate by irradiation with laser light from the supporting substrate side.

In the production method, the at least part of the region of the porous layer contains the plurality of pores having internal spaces, so that the porous layer has lower stiffness than that of the resin substrate. The energy of the pressure of a gas possibly generated from the resin substrate at the time of the laser light irradiation is consumed to break the porous layer. This reduces stress on the resin substrate and suppresses the deformation of the resin substrate, thus suppressing damage to the electronic device element formed above the resin substrate.

the average diameter of the pores in a portion of the porous layer adjacent to the resin substrate may be smaller than the average diameter of the pores in a portion of the porous layer adjacent to the supporting substrate.

Since the porous layer has the foregoing structure, when the resin substrate is formed on the porous layer, a resin material for the resin substrate is less likely to enter the pores the inner surfaces of which are exposed at the main surface of the porous layer adjacent to the resin substrate. It is thus possible to maintain the internal spaces of the pores present in a surface layer portion on the side of the main surface and suppress an increase in the stiffness of the surface layer portion on the side of the main surface of the porous layer. This prevents the fact that the pressure of a gas generated at the time of the laser light irradiation causes difficulty in breaking the porous layer. It is thus possible to maintain the effect of reducing stress on the resin substrate.

The pressure of the gas generated by the laser light irradiation is reduced by breaking the porous layer. In addition, the pressure is reduced by the distribution of the pressure to the gas present in the pores in the porous layer. In particular, when a plurality of pores communicate with each other, it is possible to obtain a higher effect of distributing pressure. Since the porous layer has the foregoing structure, the internal spaces of the pores present in the surface layer portion on the side of the main surface of the porous layer are maintained, thus maintaining the gas-pressure distributing effect.

The porous layer may include a first porous sublayer on the supporting substrate, and a second porous sublayer on the first porous sublayer, in which the average diameter of the pores in the second porous sublayer may be smaller than the average diameter of the pores in the first porous sublayer.

In this case, a resin material for the resin substrate is less likely to enter the pores in the second porous sublayer located on the side on which the resin substrate is arranged. Thus, the internal spaces of the pores are maintained, thereby maintaining the effect of reducing stress on the resin substrate. Moreover, the effect of distributing the pressure of a gas generated at the time of laser light irradiation is maintained. The first porous sublayer having the pores with an average diameter larger than that of the second porous sublayer is arranged on a side of the second porous sublayer adjacent to the supporting substrate. This reduces the stiffness of the entire porous layer to suppress the deformation of the resin substrate.

The second porous sublayer may be formed by a dry process or thermal evaporation.

In the case where the second porous sublayer is formed by a wet process, water and a solvent is left. This causes the generation of a gas at the time of heating and laser irradiation in the subsequent production process. Since the second porous sublayer is formed by a dry process or thermal evaporation, water and a solvent is not left, thereby suppressing the generation of a gas.

The first porous sublayer may be formed by the application of a first resin material. The second porous sublayer may be formed by the application of a second resin material. The viscosity of the second resin material may be higher than the viscosity of the first resin material.

In this case, when the second porous sublayer is formed on the first porous sublayer, the second resin material is less likely to enter the pores exposed at a main surface of the first porous sublayer on the side on which the second porous sublayer is formed, thus maintaining the internal spaces of the pores in the first porous sublayer. As a result, the entire porous layer has lower stiffness than that of the resin substrate.

In a state after the formation of the porous layer and before the formation of the resin substrate, some inner surfaces of the plurality of pores may be exposed at a surface serving as a main surface of the porous layer on a side on which the resin substrate is to be formed. Moreover, after the formation of the porous layer and before the formation of the resin substrate, the porous layer may be subjected to affinity treatment such that the affinity of the surface of the porous layer for a resin material used to form the resin substrate is higher than the affinity of a portion of the porous layer other than the surface.

In this case, when the resin substrate is formed by the application of the resin material on the porous layer, the resin material is less likely to enter the inside the pores exposed at the main surface of the porous layer on the side on which the resin substrate is formed. Thus, the internal spaces of the pores in the porous layer are maintained, thereby maintaining the effect of reducing stress on the resin substrate. Moreover, the effect of distributing the pressure of a gas generated at the time of laser light irradiation is maintained.

In the affinity treatment, after a thin film of a material is formed on the surface of the porous layer and the exposed inner surfaces, the UV light irradiation or the plasma treatment may be performed from the side on which the resin substrate is to be formed. The material have a lower affinity for the resin material than that of a material used to form the porous layer, and have properties in which the affinity after UV light irradiation or plasma treatment is higher than the affinity before the UV light irradiation or the plasma treatment.

The thin film may be formed by applying a solution containing a material to the surface of the porous layer and the exposed inner surfaces and performing drying. The material have a lower affinity for the resin material than that of the material used to form the porous layer, and have properties in which the affinity after UV light irradiation or plasma treatment is higher than the affinity before the UV light irradiation or the plasma treatment.

In this case, the affinity treatment is easily performed.

The pores in the portion of the porous layer adjacent to the resin substrate may have an average diameter of 1 µm or less.

In this case, when the resin substrate is formed on the porous layer, the resin material is less likely to enter the pores exposed at the main surface of the porous layer on the side on which the resin substrate is formed. Thus, the internal spaces of the pores in the portion of the porous layer adjacent to the resin substrate are maintained, thereby maintaining the effect of reducing stress on the resin substrate. Moreover, the effect of distributing the pressure of a gas generated at the time of laser light irradiation is maintained.

The pores in the second porous sublayer may have an average diameter of 1 µm or less.

In this case, when the resin substrate is formed on the second porous sublayer, the resin material is less likely to enter the pores exposed at the main surface of the second porous sublayer on the side on which the resin substrate is formed. Thus, the internal spaces of the pores in the portion of the second porous sublayer adjacent to the resin substrate are maintained, thereby maintaining the effect of reducing stress on the resin substrate. Moreover, the effect of distributing the pressure of a gas generated at the time of laser light irradiation is maintained.

The porous layer may include a coating thin layer portion free from the pores, the coating thin layer portion being arranged on a surface serving as a main surface of the porous layer on a side on which the resin substrate is formed. The coating thin layer portion may be composed of a material that is the same as that constituting a portion of the porous layer other than the coating thin layer portion.

In this case, when the resin substrate is formed on the porous layer, the resin material is blocked by the coating thin layer portion and does not enter the pores in the porous layer. Thus, the internal spaces of the pores in the porous layer are maintained, thereby maintaining the effect of reducing stress on the resin substrate. Moreover, the effect of distributing the pressure of a gas generated at the time of laser light irradiation is maintained. Furthermore, the coating thin layer portion is composed of a material that is the same as that constituting the portion of the porous layer other than the coating thin layer portion. Thus, increases in the number of steps and the types of materials are suppressed, leading to the suppression of an increase in production cost.

The porous layer may not contain inorganic particles.

Embodiments and modifications of the present disclosure will be specifically illustrated below. The structure, the effects, and the advantages will be described.

The embodiments and the modifications described below are merely examples to clearly illustrate the structures according to an aspect of the present disclosure and the effects and advantages thereof. The present disclosure is in no way limited to the following embodiments and modifications, except for its inessential features.

First Embodiment

1. Structure of Display Device

The structure of a display device according to a first embodiment of the present disclosure will be described below with reference to FIGS. 1 and 2 by taking, as an example, an active-matrix organic EL display device for which the structure is used.

Figure 1:
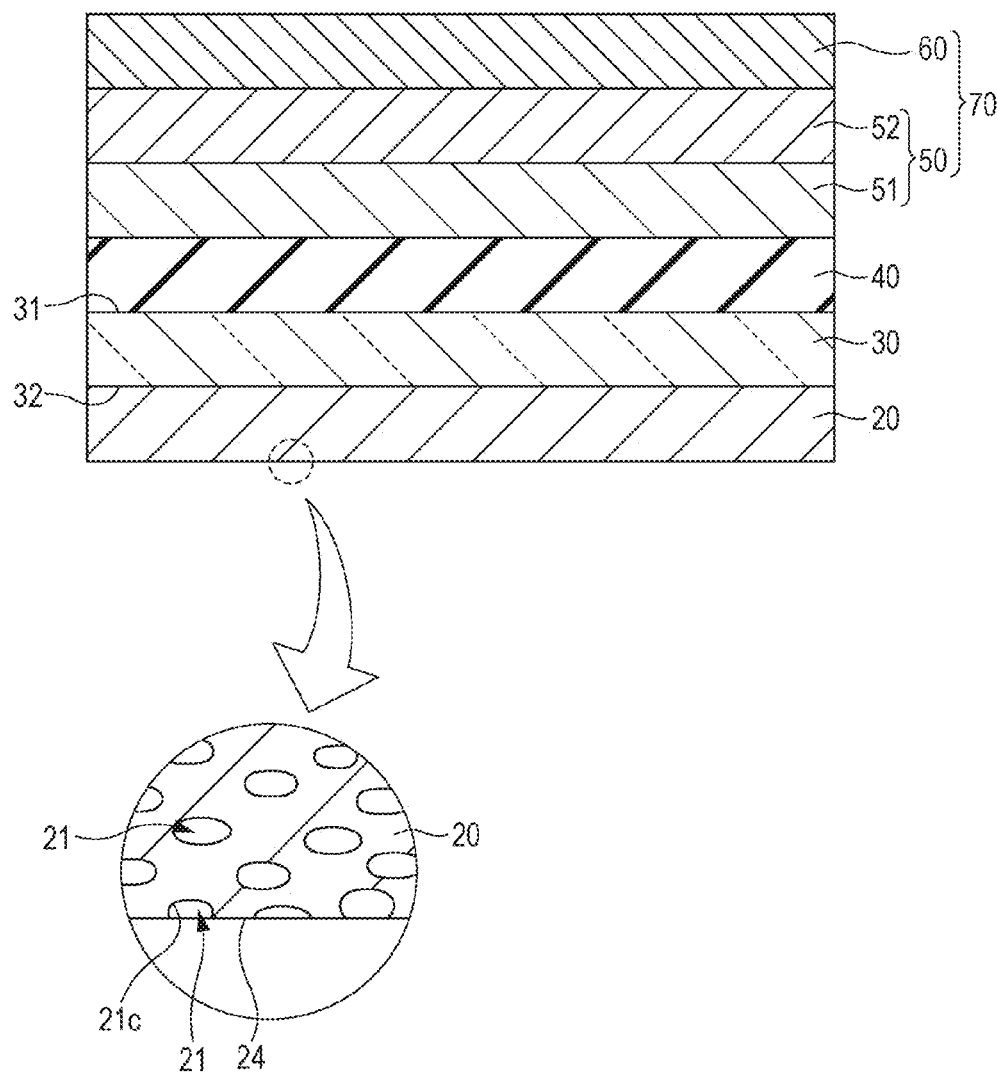
FIG. 1 is a schematic, partial cross-sectional view of the structure of a display device according to a first embodiment of the present disclosure.

FIG. 1 is a schematic, partial cross-sectional view of the structure of a display device 100 according to this embodiment. In this embodiment, the display device 100 is an active-matrix organic EL display device.

As illustrated in FIG. 1, the display device 100 includes a porous layer 20, a transparent substrate 30, a sealing layer 40, a TFT layer 50, and an organic EL element layer 60 stacked in that order. The TFT layer 50 includes an electrode layer 51 and a TFT main body layer 52. The TFT layer 50 and the organic EL element layer 60 constitute a display device element layer (or a display device element) 70. The display device 100 includes the display device element layer 70 above an upper surface (or one main surface) 31 of the transparent substrate 30 and the porous layer 20 on a lower surface (or the other main surface) 32 of the transparent substrate 30.

In FIG. 1, a figure in a circle drawn with a solid line is an enlarged cross-sectional view schematically illustrating the structure of a portion surrounded by a circle drawn with a broken line in the cross-sectional view of the display device 100 (specifically, a main surface and its vicinity of the porous layer 20 opposite to the side on which the transparent substrate 30 lies).

Porous Layer

As illustrated in the circle drawn with the solid line in FIG. 1 and FIG. 2, the porous layer 20 has many pores 21 therein. FIG. 2 is a scanning electron photomicrograph of a cross section of a portion in the vicinity of the interface between the porous layer 20 and the transparent substrate 30. As illustrated in the figure in the circle drawn with the solid line in FIG. 1, inner surfaces 21c of some of the pores 21 are exposed at a main surface 24 of the porous layer 20 opposite the side on which the transparent substrate 30 lies. Air is present in the internal spaces of the pores 21 the inner surfaces 21c of which are exposed.

In this embodiment, a gas, for example, air or a vaporized solvent, is present inside the pores 21, regardless of the pores the inner surfaces of which are exposed or not. A liquid, for example, water or a solvent, or solid foreign matter, such as dust, may be present in the internal spaces of the pores 21, in addition to the gas. For example, the pores 21 may be filled with a material having a different refractive index from a material for the porous layer 20. In this case, it is desirable to achieve a greater difference in refractive index between the material with which the internal spaces of the pores are filled and the material for the porous layer 20.

Here, the term "pores" are not limited to cell-like pores having completely closed internal spaces and is used as a concept including pores in which part of a cell-defining wall is absent, pores in which a defective portion of a wall is exposed at the outside, and pores in which the internal spaces of a plurality of cells communicate with each other.

Furthermore, the term "pores" used here indicates pores each having a diameter of, for example, 10 nm or more and 10 μm or less, and desirably 100 nm or more and 5 μm or less. In the case where a plurality of pores communicate with each other, each of the pores may have a diameter within the above range.

Here, the diameter of each of the pores indicates the length of the internal space of each pore in the direction to which a layer extends (i.e. direction perpendicular to the thickness direction of the layer).

Specifically, the porous layer 20 desirably has a porosity of, for example, 10% or more and 90% or less.

More desirably, the porous layer 20 may have a porosity of 50% or more and 90% or less. A porosity of 50% or more results in an increase in the proportion of the porous layer broken upon separating the supporting substrate with a laser, thereby resulting in a reduction in pressure applied to the transparent substrate 30. At a porosity of 90% or less, the porous layer 20 ensures mechanical strength to a certain degree. For example, it is possible to suppress breakage due to mechanical stress caused by, for example, a reduction or an increase in pressure at the time of vacuum deposition in a production process. Specifically, the breakage due to mechanical stress indicates the delamination of a film and so forth. At an excessively high porosity, when the transparent substrate 30 is formed with a resin material (for example, polyimide), the resin material enters the pores, increasing the strength of the porous layer 20. Thus, the porous layer 20 desirably has a porosity of about 90% or less.

As a method for measuring the porosity of the porous layer 20, the following method is employed: For example, a cross section of the porous layer 20 is formed by mechanical cutting or focused ion beam micromachining. The cross section is observed with a scanning electron microscope. The ratio of pores at the cross section to the division wall defining the pores is calculated. It is easily assumed that a comparable ratio is obtained in another cross section. Thus, the ratio is determined as a volume ratio and may be defined as the porosity. Furthermore, the measurement is performed at a plurality of points in the cross section. It is possible to increase the accuracy by averaging the resulting values of the porosity.

As the material for the porous layer 20, an organic material may be used.

Examples of a method for forming the porous layer 20 include, but are not particularly limited to, a wet formation method and a dry formation method. A temperature during a step of forming the porous layer 20 or a heating temperature after the formation of the porous layer 20 is desirably higher than a temperature in a step of forming each layer formed thereon. The reason for this is that when the steps of forming the upper layers are performed at a higher temperature than the formation temperature of the porous layer 20, the porous layer 20 is likely to change, which is not desirable. For example, water, a solvent, and a gas adsorbed in the pores or on a solid portion of the porous layer 20 may be desorbed at the time of the formation steps of the upper layers, causing a failure, such as separation from the upper layer.

The thickness of the porous layer 20 is desirably, but not particularly limited to, about 1 µm to about 1000 µm.

Transparent Substrate

Examples of a material for the transparent substrate 30 include, but are not particularly limited to, glass materials, such as alkali-free glass (borosilicate glass), alkali glass, soda glass, non-fluorescent glass, phosphate-based glass, borate glass, and silica; insulating materials, such as alumina; and resin materials, such as polyethylene, polypropylene, polyvinylene, polyvinylidene chloride, polyethylene terephthalate, polyethylene naphthalate, polycarbonate, polyethylene sulfonic acid, silicone, acrylic resins, epoxy resins, phenolic resins, polyamide, polyimide, and aramid resins. These materials may be used in combination as a mixture of two or more thereof. These materials may be chemically modified. Two or more of these materials may be combined to form a multilayer structure.

In the case where the display device 100 is a flexible display, the transparent substrate 30 is required to have the characteristics in which the transparent substrate 30 is not easily cracked or broken when curved. If the transparent substrate 30 does not have the characteristics, it is impossible to provide a display device with high flexibility.

In the case where the display device 100 is a flexible display, the thickness of the transparent substrate 30 is desirably in the range of 1 µm to 1000 µm. At a thickness smaller than the range, mechanical strength is not ensured. At a thickness larger than the range, the substrate is difficult to bend, thus failing to provide a display device with high flexibility.

Regarding a method for forming the transparent substrate 30, in the case where the transparent substrate is a resin material, the transparent substrate 30 may be formed by the application of a liquid resin material. In the case where the transparent substrate 30 is composed of a material, for example, a resin or glass, a plate- or film-shaped material may be bonded to the porous layer 20, without any limitation. When a plate- or film-shaped material is bonded, the bonding may be performed with an adhesive or the like or by pressure bonding. The adhesive is not particularly limited as long as a desired adhesive force is provided. Examples thereof include silicone-based adhesives and acrylic-based adhesives. The transparent substrate 30 may be a plastic substrate 330 described below.

Sealing Layer

The sealing layer 40 may be formed of, for example, a silicon nitride film.

TFT Layer

The TFT layer 50 includes a TFT configured to drive an organic EL element. The TFT layer 50 includes the electrode layer 51 formed of a gate electrode included in the TFT, and the TFT main body layer 52 constituting a portion of the TFT except the gate electrode.

The electrode layer 51 is formed by depositing a metal material by a vacuum evaporation method or a sputtering method and selectively removing the resulting metal material film by, for example, etching. Examples of a material for the electrode layer 51 include silver, aluminum, alloys of silver, palladium, and copper, and alloys of silver, rubidium, and gold.

The TFT main body layer 52 includes, for example, a gate-insulating film, source-drain electrodes, a bank, a semiconductor layer, and a passivation film. Examples of the TFT that may be used include a TFT whose channel material is silicon, a TFT whose channel material is an oxide semiconductor, such as an indium-gallium-zinc oxide, and a TFT whose channel material is an organic semiconductor, such as pentacene.

Organic EL Element Layer

The organic EL element layer 60 includes an upper electrode, a lower electrode, and an organic functional layer arranged between the upper electrode and the lower electrode. The organic functional layer includes a light-emitting layer. The organic functional layer may appropriately include an electron injection layer, an electron transport layer, a hole injection layer, a hole transport layer, and other layer, in addition to the light-emitting layer. The organic EL element layer 60 may include a partition layer, a sealing layer, and so forth, in addition to the upper electrode, the lower electrode, and the organic functional layer. The organic EL element layer 60 may further include a color filter and a protective filter.

The TFT layer 50 and the organic EL element layer 60 constitute the display device element layer 70.

In this embodiment, the TFT layer 50 has a multilayer structure including the electrode layer 51 and the TFT main body layer 52. However, the TFT layer 50 is not limited to the structure. For example, in the case where the display device 100 is a passive-matrix organic EL display device, a wiring layer corresponds to the TFT layer 50.

In the case where the display device 100 is a liquid crystal display device, LCD elements are arranged in the display device element layer 70.

2. Suppression of Reflection

FIG. 3A is a partial cross-sectional view schematically illustrating the state of suppression of the formation of reflected images when the structure of the display device 100 according to this embodiment is used for a display device 100a having a bottom-emission structure. FIG. 3B is a partial cross-sectional view schematically illustrating the state of suppression of the formation of reflected images when the structure of the display device 100 according to this embodiment is used for a display device 100b having a top-emission structure.

In the case of the display device 100a having a bottom-emission structure illustrated in FIG. 3A, light that expresses image information emitted from the light-emitting layer in the organic EL element layer 60 is transmitted through the TFT layer 50, the sealing layer 40, the transparent substrate 30, and the porous layer 20 to enter the eyes of a user. In this case, the porous layer 20 is composed of a material that transmits light.

Meanwhile, extraneous light is reflected from a surface of the porous layer 20 (i.e. a main surface of the porous layer 20 opposite to the side on which the transparent substrate 30 lies) and enters the eyes of the user together with light that expresses image information. This is recognized by the user as reflected images, causing a reduction in the visibility of the image information. However, as illustrated in the circle drawn by the solid line of FIG. 1, the inner surfaces 21c of some pores 21 in the porous layer 20 are exposed at the surface of the porous layer 20 to form irregularities. This scatters extraneous light at the surface of the porous layer 20 to reduce reflected light that enters the eyes of the user, thereby suppressing the formation of reflected images. Furthermore, extraneous light passes through the surface of the porous layer 20 and enters the porous layer 20 is also scattered by refraction and reflection when passes through the interfaces between the solid portion of the porous layer 20 and the gas portions inside the pores 21 in the porous layer 20. Thus, extraneous light that passes through the porous layer 20 and is incident on the transparent substrate 30 is reduced. This reduces reflection from the interface between the transparent substrate 30 and the sealing layer 40, reflection from the interface between the sealing layer 40 and the display device element layer 70, reflection from the interfaces between the layers constituting the display device element layer 70, and reflection from the surfaces of components, such as electrodes, thereby further suppressing the formation of reflected images.

As illustrated in FIG. 2, the porous layer 20 includes a coating thin layer portion 22 on the surface of the porous layer 20 adjacent to the transparent substrate 30, the coating thin layer portion 22 having a thickness of about 1 μm and being free from a pore. Thus, when the resin material is applied to the porous layer 20 to form the transparent substrate 30, the resin material does not enter the pores, so that the internal spaces of the pores are not filled with the resin material. Thus, the internal spaces of the pores in the porous layer 20 are maintained, thereby advantageously maintaining a large amount of light scattered.

In the case of the display device 100b having a top-emission structure, light emitted from the organic functional layer in the organic EL element layer 60 emerges from the upper surface of the organic EL element layer 60, i.e., is emitted to the outside through the upper electrode. Thus, the upper electrode composed of a material that transmits light (i.e. transparent conductive film) is used. In recent years, in the case of a transparent display, a material with satisfactory optical transparency has often been used for the lower electrode and the TFT layer 50. Thus, extraneous light that enters the display device 100b from the outgoing light side of the organic EL element layer 60, i.e., from the side of a user, enters the porous layer 20 through the organic EL element layer 60, the TFT layer 50, the sealing layer 40, and the transparent substrate 30. The light that enters the porous layer 20 reaches the back surface of the porous layer 20 (i.e. a main surface of the porous layer 20 opposite to the side adjacent to the user, and here, the main surface of the porous layer 20 opposite the side on which the transparent substrate 30 lies). Air, which is in a gaseous state, is present outside the porous layer 20, which is in a solid state. Thus, extraneous light seems easily reflected from the back surface, which is the interface therebetween, of the porous layer 20. The inner surfaces 21c of some pores 21 in the porous layer 20 are exposed at the back surface of the porous layer 20 to form irregularities, as illustrated in the circle drawn by the solid line in FIG. 1. Thus, the extraneous light that reaches the back surface of the porous layer 20 through the layers in the display device 100b is scattered at the back surface of the porous layer 20, thereby reducing the reflection of the extraneous light at the back surface. This reduces the extraneous light that is reflected from the back surface of the porous layer 20 and passes again through the layers in the display device 100b to enter the eyes of the user, thereby suppressing the formation of reflected images.

In the case of a display device 500b having a top-emission structure illustrated in FIG. 13B not according to this embodiment, light that is obliquely incident on the display device from the outside is easily reflected from components in the display device element layer 570 and does not easily reach the back surface of the transparent substrate 530. Similarly, light that is reflected from the back surface of the transparent substrate 530 is also reflected from components in the display device element layer 570 and is not easily emitted to a user. Thus, in the case where the display device having a top-emission structure is used, the amount of light that is reflected from the back surface of the transparent substrate 530 to be emitted toward the user is small.

However, light vertically incident on a display surface of the display device (in the display device 500b, a main surface of the organic EL element layer 560 adjacent to the user), specifically, light incident on a transparent region, such as an interpixel region, is reflected. In this case, the reflected light may be emitted to the user. This may adversely affect the visibility of an image, as with the bottom-emission structure.

Even in such a case, in the display device 100b having a top-emission structure for which the structure of the display device 100 according to this embodiment is used, it is possible to suppress the formation of reflected images as described above.

In the case of a display device including a flat glass substrate not according to this embodiment, requirements for the formation of reflected images are circumvented by slightly tilting the angle of the display device. Thus, the visibility is relatively easily improved.

In contrast, in the case of a flexible display device in which a flexible material, such as a resin substrate, is used for a substrate and the display device can be used in a curved state, the angle of reflection from a display surface is continuously present with respect to a user. Thus, even if the angle is adjusted, a point having an angle that forms reflected images is changed. It is difficult to adjust the angle that completely circumvents requirements for the formation of reflected images. Accordingly, in particular, in the case of a flexible display device having a curved display, it is particularly important that the reflection of light from the back surface side of the transparent substrate should be suppressed.

Even in this case, in the display device 100b having a top-emission structure for which the structure of the display device 100 according to this embodiment is used, it is possible to effectively suppress the formation of reflected images as described above.

As illustrated in FIG. 2, in the porous layer 20 according to this embodiment, the diameters of pores 21a in a portion near the transparent substrate 30 are generally smaller than those of pores 21b in a portion further away from the transparent substrate 30. In other words, the average diameter of the pores 21a is smaller than the average diameter of the pores 21b. The term "average diameter" may be represented by an average diameter obtained in an area of 10×10 μm$^2$. For example, the average diameter may be represented by an average diameter obtained by the observation of two or three points in a cross section of the porous layer 20 with a focused ion beam (FIB) scanning electron microscope (SEM).

In the case of a display device having a top-emission structure, incident light that would not reflected in the direction to the eyes of a user if the porous layer 20 were not provided may be scattered at the porous layer 20 to reach the eyes of the user.

If the average diameter of the pores 21 in a portion near the transparent substrate 30 is larger, the number of the pores 21 per unit volume is small in the portion near the transparent substrate 30. Thus, the number of refractions and reflections of incident light is small in the portion. For this reason, the incident light is less scattered and is reflected to the user side while the intensity of light remains high, in some cases.

However, in the display device 100 according to this embodiment, as described above, the average diameter of the pores 21a in a portion of the porous layer 20 near the transparent substrate 30 is smaller than the average diameter of the pores 21b in a portion of the porous layer 20 further away from the transparent substrate 30. Thus, the number of the pores 21 per unit volume in the portion near the transparent substrate 30 is larger than that in the portion further away from the transparent substrate 30. Hence, the number of refractions and reflections of incident light is large in the portion near the transparent substrate 30, thereby more uniformly scattering the incident light. As a result, when the incident light is reflected in the portion near the transparent substrate 30 to the user side, the reflected light is weakened by the scattering. It is thereby possible to suppress the influence of light reflected from the porous layer 20.

In the case of a display device having a bottom-emission structure, the pores 21a in the portion of the porous layer 20 near the transparent substrate 30 have a small average diameter, and the porous layer 20 contains the pores with different average diameters; hence, it is possible to scatter light in a wider wavelength range. This results in the effect of effectively scattering all visible light.

3. Method for Producing Display Device

A method for producing the display device 100 according to this embodiment will be described below with reference to FIGS. 4A to 4D, 5A to 5C, 6A and 6B, and 7. FIGS. 4A to 4D, 5A to 5C, and 6A and 6B are partial cross-sectional views schematically illustrating some steps in a procedure for producing the display device 100 according to this embodiment. FIG. 7 is a schematic flow chart of the procedure for producing the display device 100 according to this embodiment.

Figure 4A:
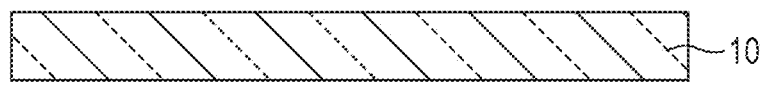
FIGS. 4A to 4D are partial cross-sectional views schematically illustrating some steps in a procedure for producing a display device according to the embodiment.

As illustrated in FIG. 4A, a supporting substrate 10 is prepared (step S1 in FIG. 7). The supporting substrate 10, on which the display device 100 is to be formed, is a member serving as a base used for the formation of the display device 100.

Examples of a material for the supporting substrate 10 include, but are not particularly limited to, glass materials, such as alkali-free glass (borosilicate glass), alkali glass, soda glass, non-fluorescent glass, phosphate-based glass, borate glass, and silica; and insulating materials, such as alumina. In this embodiment, a specific example of the supporting substrate 10 is EAzLE 2000, manufactured by Corning Incorporated.

A surface of the supporting substrate 10 (a main surface of the supporting substrate 10 on the side on which the display device 100 is to be formed) desirably has a high degree of flatness because a thin-film device element, such as a display device element, is formed after the temporal fixation of the transparent substrate 30. Specifically, the surface has a maximum level difference of 10 μm or less and desirably 1 μm or less.

The surface of the supporting substrate 10 is desirably in a clean state in order to achieve good adhesion to a layer to be formed thereon. As a method for cleaning the surface, for example, UV light irradiation, ozone treatment, plasma treatment, or hydrofluoric acid treatment may be employed. In this embodiment, specifically, for example, the supporting substrate 10 is subjected to excimer UV (wavelength: 172 nm) treatment to clean the surface.

A single layer configured to improve adhesion to a layer to be formed thereon may be formed on a surface of the supporting substrate 10. As the layer configured to improve adhesion, for example, a silicon oxide film may be used.

Figure 4B:

As illustrated in FIG. 4B, the porous layer 20 is formed on the supporting substrate 10 (step S2 in FIG. 7). In this embodiment, specifically, for example, a polyimide is applied to the supporting substrate 10 by a spin coating method. The applied polyimide is heated at a heating temperature of 400° C. for 8 hours, thereby forming an 18-μm-thick porous polyimide layer serving as the porous layer 20. A specific example of the polyimide used as a material for the porous layer 20 is U Imide Varnish Type BP manufactured by Unitika Limited.

Figure 4C:
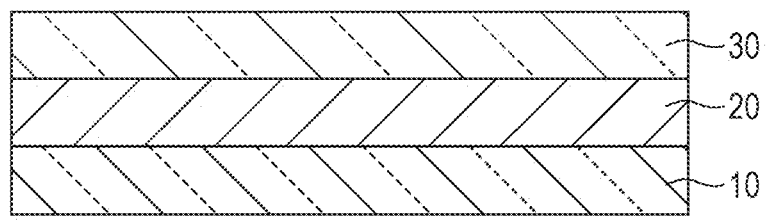

As illustrated in FIG. 4C, the transparent substrate 30 serving as a substrate for a flexible display is formed on the porous layer 20 (step S3 in FIG. 7). In this embodiment, specifically, for example, a polyimide layer having a thickness of 30 μm is formed by a spin coating method on the porous layer 20, thereby forming the transparent substrate 30 serving as a substrate for a flexible display. A specific example of the polyimide used as a material for the transparent substrate 30 is U-Varnish manufactured by Ube Industries, Ltd.

Figure 4D:
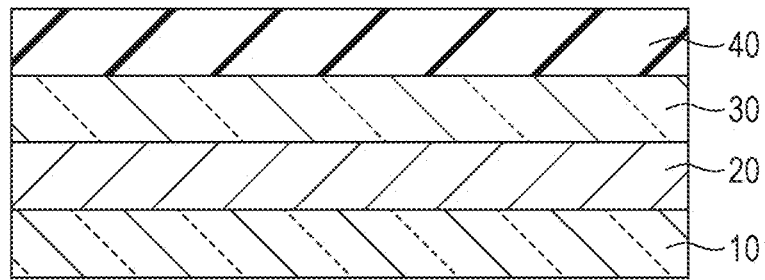

As illustrated in FIG. 4D, the sealing layer 40 is formed on the transparent substrate 30 (step S4 in FIG. 7). In this embodiment, specifically, for example, a 1-μm-thick silicon nitride film serving as the sealing layer 40 is formed by capacitively coupled plasma-enhanced chemical vapor deposition (CVD) at 300° C.

Figure 5A:
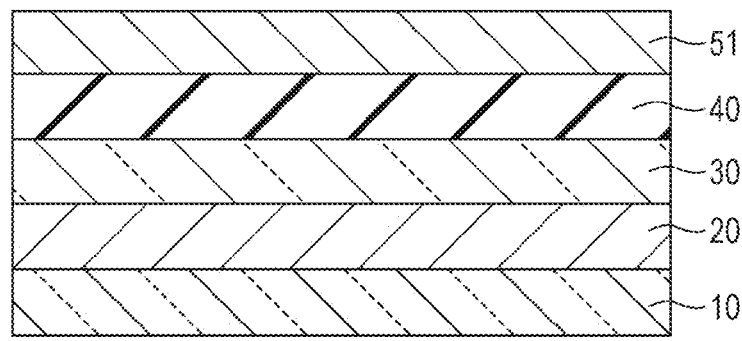
FIGS. 5A to 5C are partial cross-sectional views schematically illustrating some steps in the procedure for producing the display device continued from FIG. 4D.

As illustrated in FIG. 5A, a thin metal film is formed on the sealing layer 40 and then is subjected to etching treatment, thereby forming the electrode layer 51 (step S5 in FIG. 7). In this embodiment, specifically, for example, a 100-nm-thick layer composed of an alloy of molybdenum and tungsten is formed by a sputtering method. The layer is patterned by a photolithography method with a resist and then subjected to etching treatment with a liquid mixture of phosphoric acid, nitric acid, and acetic acid, thereby forming the electrode layer 51.

Figure 5B:
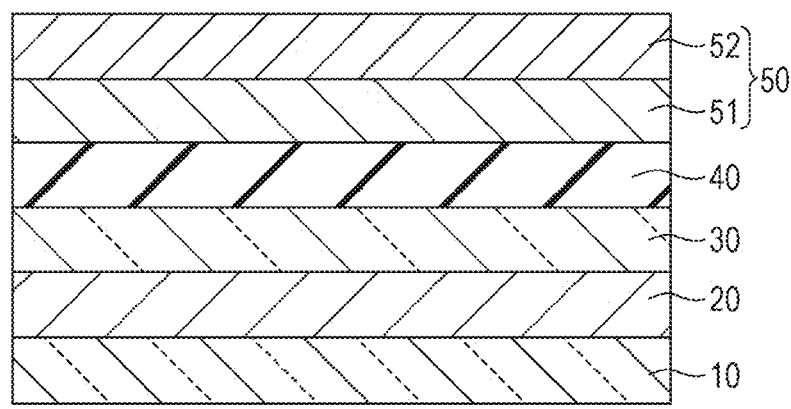

As illustrated in FIG. 5B, the TFT main body layer 52 is formed on the electrode layer 51, thereby completing the TFT layer 50 (step S6 in FIG. 7).

Figure 5C:
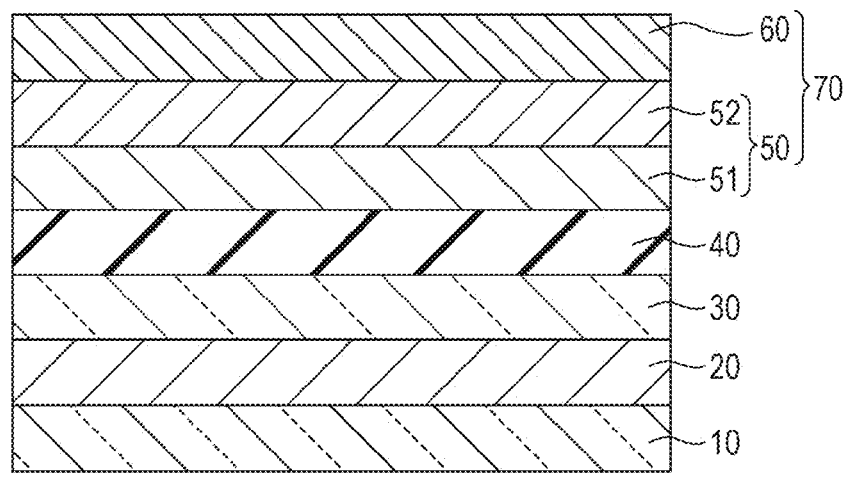

As illustrated in FIG. 5C, the organic EL element layer 60 is formed on the TFT layer 50 (step S7 in FIG. 7), thereby providing an electron device body 1000 in which the display device 100 is formed on the supporting substrate 10.

As illustrated in FIG. 6A, the porous layer 20 is broken at a portion in the porous layer 20 to separate the transparent substrate 30 from the supporting substrate 10 (step S8 in FIG. 7), thereby providing the display device 100 as illustrated in FIG. 6B.

For the separation of the supporting substrate 10, the following method may be employed: a method in which the electron device body 1000 is irradiated with laser light from the supporting substrate 10 side, or a method in which mechanical separation is performed with a roller. In this embodiment, specifically, for example, the supporting substrate 10 is separated by irradiation with excimer laser light having a wavelength of 305 nm, a pulse width per pulse of 20 ns, an irradiation area of 20.0 mm×1.0 mm from the supporting substrate 10 side while the excimer laser light is swept.

This embodiment is not limited to the state in which the porous layer 20 is broken at a portion in the porous layer 20 to separate the supporting substrate 10 and part of the porous layer 20 is attached to the transparent substrate 30, as illustrated in FIG. 6A. When the supporting substrate 10 is separated from the porous layer 20 at the interface between the porous layer 20 and the supporting substrate 10, the entire porous layer 20 may be attached to the transparent substrate 30. In other words, at least part of the porous layer 20 may be attached to the transparent substrate 30 after the separation of the supporting substrate 10. In this case, however, it is desirable that a main surface of the transparent substrate 30 opposite to the side on which the sealing layer 40 lies be completely covered with the porous layer 20. If the main surface is not completely covered, at least a region corresponding to an image display region is desirably covered with the porous layer 20.

In the display device 100 according to this embodiment, as illustrated in FIG. 2, the average diameter of the pores 21a in the portion of the porous layer 20 near the transparent substrate 30 is smaller than the average diameter of the pores 21b in the portion of the porous layer 20 further away from the transparent substrate 30. This reduces irregularities on an upper surface of the porous layer 20 (i.e. a main surface of the porous layer 20 on the side on which the transparent substrate 30 is formed) and reduces the influence of the irregularities on the layers formed on and above the porous layer 20, thereby providing a higher-quality display device.

Specifically, the average diameter of the pores in the portion of the porous layer 20 adjacent to the transparent substrate 30 is desirably, for example, 10 nm or more and 100 nm or less. Specifically, the average diameter of the pores in the portion of the porous layer 20 adjacent to the supporting substrate 10 is desirably, for example, 100 nm or more and 10 μm or less.

To solve the problem of the formation of reflected images, a method is conceivable in which a filler is dispersed in the transparent substrate to suppress the reflection of incident light. In this case, however, irregularities are formed on an upper surface of the transparent substrate by the influence of the filler. As a result, the sealing performance of the sealing layer 40 formed thereon is disadvantageously reduced. The structure of the display device 100 according to this embodiment suppresses the formation of reflected images without reducing the sealing performance of the sealing layer 40.

In the case where a polarizing film is used in order to suppress the formation of reflected images, particularly in the case of a bottom-emission structure, light that expresses image information is also changed. The amount of light that enters the eyes of a user is reduced, disadvantageously significantly reducing the brightness of a display screen. The structure of the display device 100 according to this embodiment suppresses the formation of reflected images without a significant reduction in the brightness of the display screen.

Modification

While the present disclosure has been described on the basis of the embodiment, the present disclosure is not limited to the foregoing embodiment. The following modifications may be performed.

First Modification

In the foregoing embodiment, the porous layer 20 includes the coating thin layer portion 22. However, the porous layer 20 is not limited thereto. The porous layer 20 may have a structure free from the coating thin layer portion 22.

In this case, the average diameter of the pores in a portion of the porous layer 20 adjacent to the transparent substrate 30 is desirably smaller than the average diameter of the pores in a portion of the porous layer 20 adjacent to the supporting substrate. In the case of a smaller average diameter of the portion of the porous layer 20 adjacent to the transparent substrate 30, when the transparent substrate 30 is formed by application with a resin material, the resin material is less likely to enter the pores. Thus, the internal spaces are maintained, thereby maintaining the effect of scattering light in the portion of the porous layer 20 near the transparent substrate 30.

In the foregoing embodiment, the porous layer 20 is formed by applying a resin material and then heating the applied resin material. In general, bubbles of a solvent disappear more easily at a position closer to a surface. Thus, the pores closer to the surface have a smaller average diameter. The heating temperature, the heating time, and the type and amount of the solvent in the resin material at the time of the formation of the porous layer 20 may be adjusted in such a manner that the coating thin layer portion 22 is not formed.

Second Modification

In the display device 100 according to the foregoing embodiment, while the porous layer 20 has a single-layer structure, the porous layer 20 is not limited thereto. The porous layer 20 may have a multilayer structure including a plurality of sublayers.

Figure 8A:
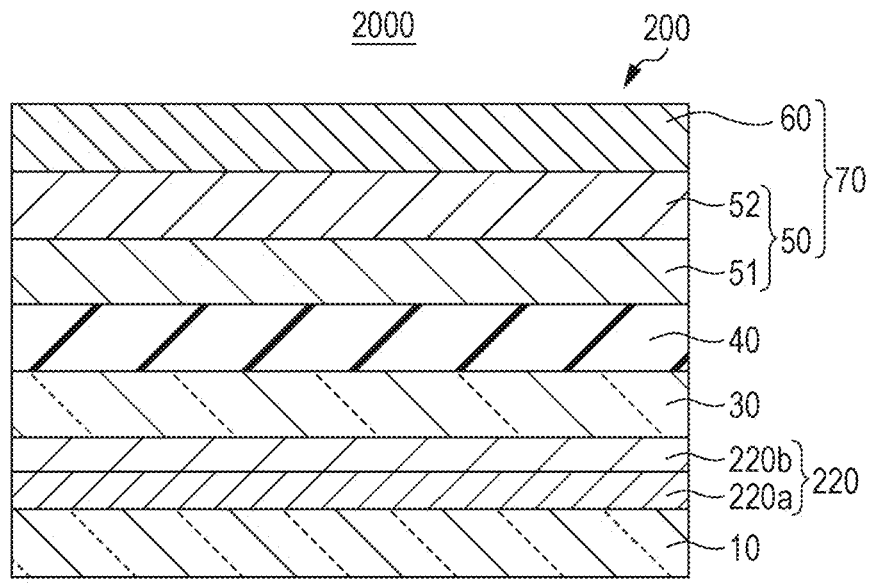
FIG. 8A is a partial cross-sectional view schematically illustrating a state in which a display device according to a second modification of the embodiment is formed on a supporting substrate.
Figure 8B:
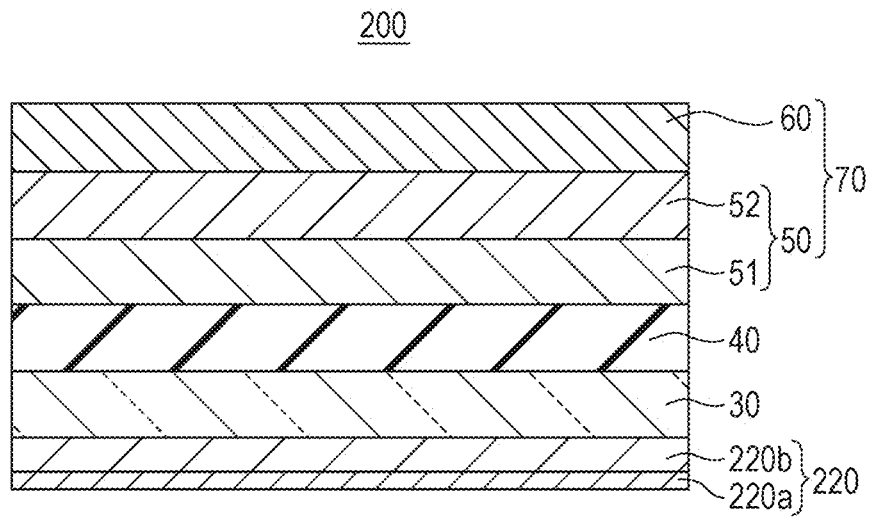
FIG. 8B is a partial cross-sectional view schematically illustrating the structure of the display device according to the second modification of the embodiment.

FIG. 8A is a partial cross-sectional view schematically illustrating an electron device body 2000 in which a display device 200 according to a second modification is arranged on the supporting substrate 10. FIG. 8B is a partial cross-sectional view schematically illustrating the structure of the display device 200.

As illustrated in FIGS. 8A and 8B, the display device 200 includes the porous layer 220. The porous layer 220 includes two sublayers: a first porous sublayer 220a and a second porous sublayer 220b.

Figure 9A:
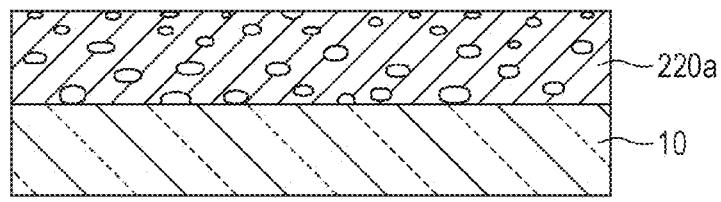
FIGS. 9A to 9D are partial cross-sectional views schematically illustrating some steps in a procedure for producing the display device according to the second modification of the embodiment.
Figure 9B:
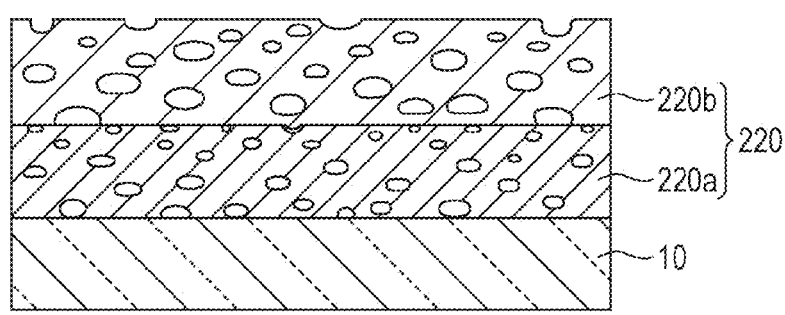
Figure 9C:
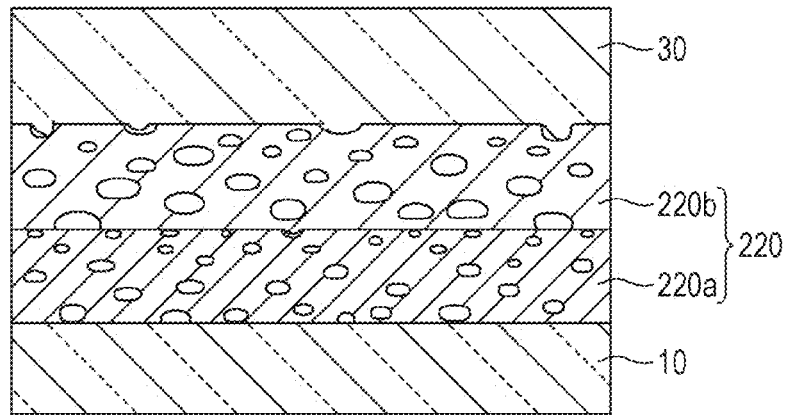
Figure 9D:
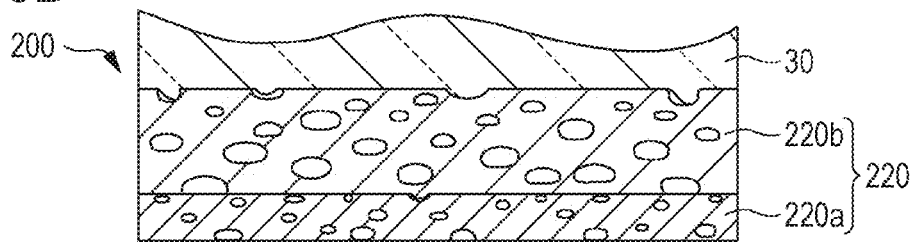

FIGS. 9A to 9D are partial cross-sectional views schematically illustrating some steps in a procedure for producing the display device 200. FIG. 9A is a partial cross-sectional view schematically illustrating a state in which the first porous sublayer (first porous sublayer portion) 220a is formed on the supporting substrate 10. FIG. 9B is a partial cross-sectional view schematically illustrating a state in which the second porous sublayer (second porous sublayer portion) 220b is formed on the first porous sublayer 220a. FIG. 9C is a partial cross-sectional view schematically illustrating a state in which the transparent substrate 30 is formed on the second porous sublayer 220b. FIG. 9D is a partial cross-sectional view of the porous layer 220 and the transparent substrate 30 of the display device 200 after the separation of the supporting substrate 10. In FIG. 9D, the sealing layer 40, the TFT layer 50, and the organic EL element layer 60 are not illustrated.

As illustrated in FIGS. 9B, 9C, and 9D, in the display device 200 according to the second modification, the average diameter of pores in the first porous sublayer 220a is smaller than the average diameter of pores in the second porous sublayer 220b.

As described in the first modification, in the case where the porous layer is formed by applying a resin material and then heating the applied resin material, in general, the average diameter of the pores is smaller in a portion closer to a surface.

In the case where a single porous layer is formed as in the display device 100 according to the foregoing embodiment, if the pores in the porous layer 20 have an excessively small average diameter, a low-porosity portion having a very small diameter and a pore-free portion in which pores disappear are formed in the vicinity of the surface. In particular, when the structure is used for a display device having a top-emission structure, the effect of sufficiently scattering light is less likely to be provided.

In the case where the pores in the porous layer 20 have a large average diameter, in particular, in the case of a display device having a bottom-emission structure, a portion of the porous layer 20 in close contact with the supporting substrate 10, i.e., a portion where the pores have large diameters, is exposed on the user side. In this case, an excessively large diameter of the pores can cause irregularities on the display surface to increase, thereby degrading the impression of the appearance and images to be displayed. In the case where a display functions also as a touch screen, the touch is not smooth when a user touches it with a finger, thus possibly failing to provide a satisfactory operational feeling.

In the display device 200 according to the second modification, the porous layer 220 includes the first porous sublayer 220a and the second porous sublayer 220b arranged on the first porous sublayer 220a. The average diameter of the pores in the first porous sublayer 220a is smaller than the average diameter of the pores in the second porous sublayer 220b. Thus, even in the case where the display device 200 is used for a display device having a top-emission structure, the pores in the second porous sublayer 220b adjacent to the transparent substrate 30 have a larger average diameter; hence, the porosity is ensured to provide the effect of sufficiently scattering light. In the case where the display device 200 is used for a display device having a bottom-emission structure, as illustrated in FIG. 9D, the first porous sublayer 220a that contains the pores having a small average diameter is exposed on the user side, thereby resulting in a display surface having smaller irregularities. This inhibits the degradation of the impression of the appearance and images to be displayed. In addition, even in the case of a touch-screen display device, it is possible to provide a smooth operational feeling because of small irregularities on the surface of the touch screen.

As with the porous layer 220 according to the second modification, the average diameter of the pores in a portion of the porous layer 220 opposite to the side adjacent to the transparent substrate 30 (in this case, the first porous sublayer 220a) may be smaller than the average diameter of the pores at a predetermined position in the porous layer 220 in the thickness direction (in this case, a portion of the second porous sublayer 220b adjacent to the first porous sublayer 220a).

In the second modification, the porous layer 220 includes the two sublayers. However, the porous layer 220 is not limited thereto. The porous layer 220 may include three or more sublayers.

Third Modification

In the second modification, the second resin material for the formation of the second porous sublayer 220b desirably has a higher viscosity than that of the first resin material for the formation of the first porous sublayer 220a. In this case, the second resin material for the formation of the second porous sublayer 220b is less likely to enter the pores in the first porous sublayer 220a, thereby maintaining the porosity of the first porous sublayer 220a.

Fourth Modification

In the second modification, the case where the average diameter of the pores in the first porous sublayer 220a is smaller than the average diameter of the pores in the second porous sublayer 220b has been described. However, the present disclosure is not limited thereto. The average diameter of the pores in the first porous sublayer 220a may be larger than the average diameter of the pores in the second porous sublayer 220b.

In this case, the effect of scattering light is enhanced in the first porous sublayer 220a containing the pores having a larger average diameter. Thus, incident light is markedly scattered at a region further away from a surface from which light that expresses image information emerges (here, the light-emitting layer in the organic EL element layer 60), thereby suppressing the influence of the scattered light on a display image.

Fifth Modification

In the case where the porous layer 220 includes the first porous sublayer 220a and the second porous sublayer 220b as with the second modification, the second porous sublayer 220b may be formed by any one of dry processes selected from a chemical vapor deposition method, a sputtering method, and an evaporation method. When the second porous sublayer 220b is formed by a wet process, water and a solvent are left in the pores and a solid portion of the second porous sublayer 220b. Thus, in the cases where a subsequent heating step is performed and where laser irradiation is performed for the separation of the supporting substrate 10 in the production process, water and the solvent cause the generation of gases. In the case where the second porous sublayer 220b is formed by a dry process or thermal evaporation, water and a solvent are not left, thereby inhibiting the generation of a gas.

Sixth Modification

In the case where the transparent substrate 30 is bonded to the porous layer 20, an adhesive layer may be provided between the porous layer 20 and the transparent substrate 30. The adhesive layer is typically formed by application. Thus, when the pores in a surface portion of the porous layer 20 on the side on which the transparent substrate 30 is formed have a smaller average diameter, a material constituting the adhesive layer is less likely to penetrate into the pores. Also in the case of the bonding, when the pores in the surface portion of the porous layer 20 on the side on which the transparent substrate 30 is formed have a smaller average diameter, a larger area of a surface of the porous layer 20 in close contact with the transparent substrate 30 is provided, compared with the case of a large average diameter, thereby increasing the adhesion to the transparent substrate 30. This prevents accidental detachment of the transparent substrate 30 from the porous layer 20 in the course of the production process of the display device.

Seventh Modification

The pores present in a portion of the porous layer 20 in the vicinity of a main surface of the porous layer 20 adjacent to the transparent substrate 30 may be filled with a resin material for the transparent substrate 30, and the pores in a portion of the porous layer 20 opposite the side on which the transparent substrate 30 lies may contain a gas and may have internal spaces. When the pores have the internal spaces, a greater difference in refractive index is achieved at the time of the passage of light through the inner surfaces of the pores, thereby increasing the scattering of light. By filling the pores in the portion adjacent to the transparent substrate 30 with the resin material and maintaining the unfilled pores in the portion remote from the transparent substrate 30, incident light is markedly scattered at a region further away from a surface from which light that expresses image information emerges. In this case, the light that expresses image information emerges from the surface of the light-emitting layer in the organic EL element layer 60. Thereby, the influence of the scattered light on a display image is suppressed.

Eighth Modification

In the case where the transparent substrate 30 is formed by the application of a resin material, affinity treatment may be performed after a step of forming the porous layer 20 and before a step of forming the transparent substrate 30. The affinity treatment may be performed such that the affinity of a surface 23 of the porous layer 20 (i.e. a main surface of the porous layer 20 on the side on which the transparent substrate 30 is to be formed) for the resin material used to form the transparent substrate 30 (hereinafter, referred to simply as "resin affinity") is higher than the resin affinity of the inner surfaces 21c of the pores 21 exposed at the surface 23.

A method of the affinity treatment will be described below with reference to FIGS. 10A to 11C.

Figure 10A:
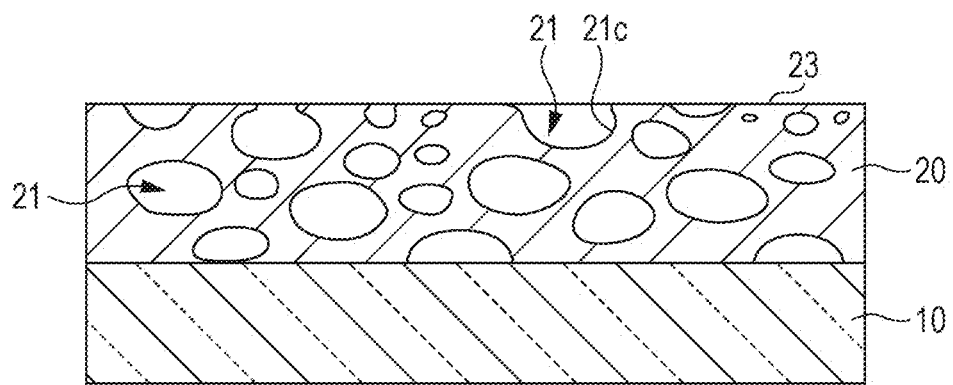
FIGS. 10A and 10B are partial cross-sectional views schematically illustrating some steps in a procedure for producing a display device according to an eighth modification of the embodiment.

FIG. 10A is a partial cross-sectional view illustrating a state in which the porous layer 20 is formed on the supporting substrate 10. As illustrated in the figure, the inner surfaces 21c of some pores 21 are exposed at the surface 23 of the porous layer 20.

Figure 10B:
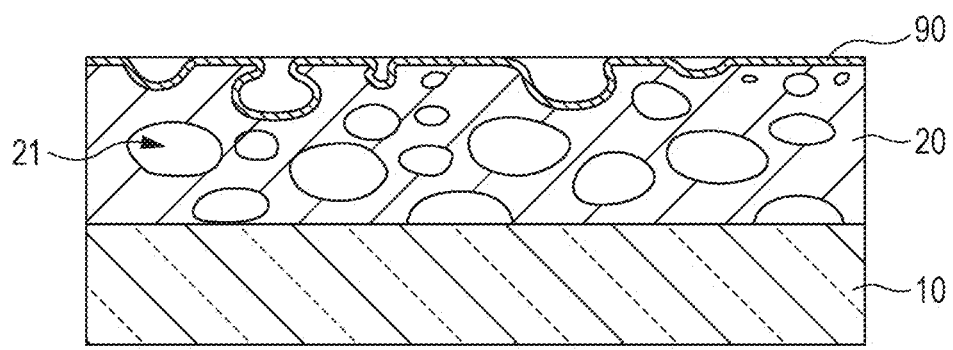

As illustrated in FIG. 10B, a thin film 90 having a low resin affinity is formed on the surface 23 and the inner surfaces 21c. The thin film 90 may be formed by, for example, applying a solution containing a material having a low resin affinity to the surface 23 and the inner surfaces 21c and then performing drying.

Figure 11A:
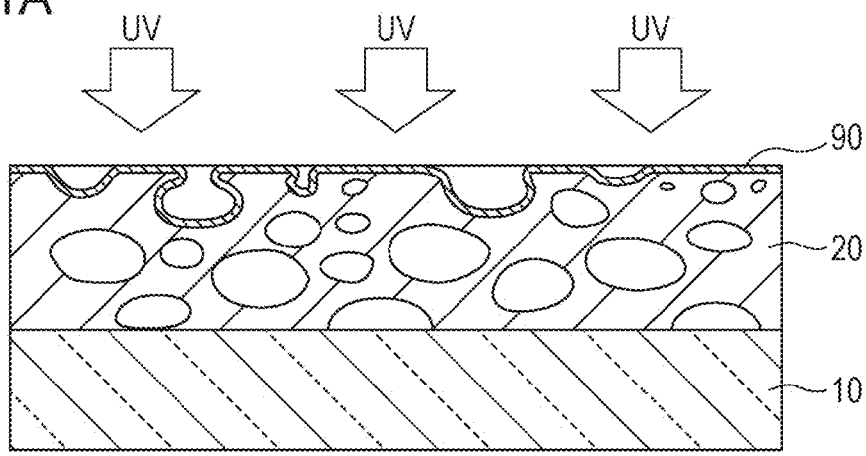
FIGS. 11A to 11C are partial cross-sectional views schematically illustrating some steps in the procedure for producing the display device according to the eighth modification of the embodiment continued from FIG. 10B.
Figure 11B:
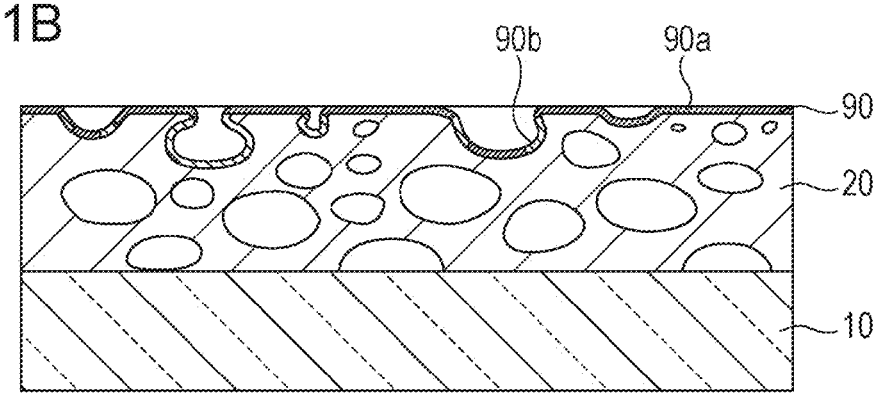

As illustrated in FIG. 11A, the thin film 90 is irradiated with UV light. Thereby, as illustrated in FIG. 11B, a portion of the thin film 90 formed on the surface 23 of the porous layer 20, portions of the thin film 90 formed on shallow portions of the inner surfaces 21c of the pores 21, and portions of the thin film 90 formed on regions corresponding to bottoms of wide openings are exposed to the UV light to increase the resin affinity, resulting in high-resin-affinity portions 90a. A sufficient amount of UV light does not reach portions of the thin film 90 formed on deep portions of the inner surfaces 21c of the pores 21 and inclined portions of the thin film 90 substantially parallel to the irradiation direction of the UV light and being formed near openings. Thus, these portions are not exposed to the UV light. The resin affinity of these portions is maintained at a low level, providing low-resin-affinity portions 90b.

In this modification, the thin film 90 is included in the porous layer 20. The portions of the thin film 90 exposed to the UV light are included in the surface 23 of the porous layer 20. The portions of the thin film 90 not exposed to the UV light are included in the inner surfaces 21c of the pores 21 in the porous layer 20.

Figure 11C:
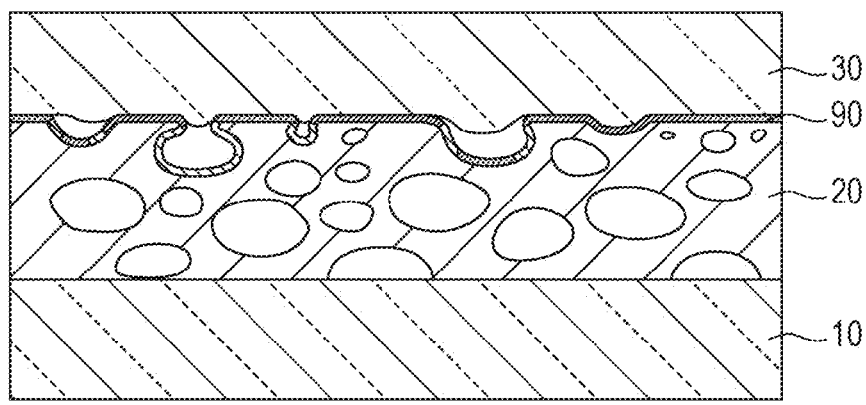

As illustrated in FIG. 11C, the resin material is applied to the thin film 90 to form the transparent substrate 30. At this time, the low-resin-affinity portions 90b are present in the inner surfaces 21c of the pores 21. Thus, the resin material is less likely to enter the pores, thereby maintaining the porosity in the portion of the porous layer 20 in the vicinity of the surface.

The high-resin-affinity portions 90a are formed on the surface 23, resulting in high adhesion between the porous layer 20 and the transparent substrate 30. This prevents accidental detachment of the transparent substrate 30 from the porous layer 20 in the subsequent steps in the production process of the electronic device.

While UV light is used for the resin affinity treatment as described above, the affinity treatment is not limited thereto. The affinity treatment may be performed by irradiation with light (visible light) or plasma treatment in place of irradiation with UV light, depending on the type of the thin film 90.

Another Underlying Knowledge Forming Basis of the Present Disclosure

The present disclosure relates to a method for producing an electronic device and a laminated substrate. In particular, the present disclosure relates to a method for producing an electronic device, in which damage to the electronic device upon separating a supporting substrate is reduced, and relates to a laminated substrate used in the method.

Figure 28A:
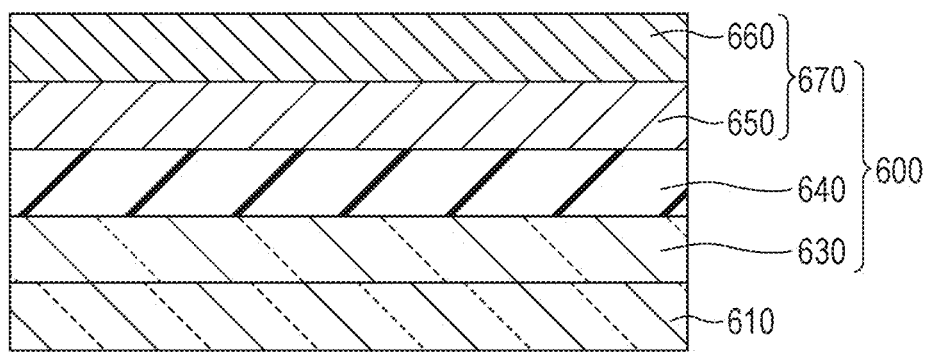
FIG. 28A is a partial cross-sectional view schematically illustrating a state in which an electronic device not according to the embodiment is arranged on a supporting substrate.

FIG. 28A is a cross-sectional view schematically illustrating a state in which an active-matrix organic EL display device serving as an electronic device not according to an embodiment of the present disclosure is used as an example and the electronic device is formed on a supporting substrate. An electron device body 9000 in which an electronic device 600 (i.e. the organic EL display device) not according to an embodiment of the present disclosure is formed on a supporting substrate 610 includes the supporting substrate 610 composed of glass, a plastic substrate 630 mainly composed of a resin material, a sealing layer 640, a thin film transistor (TFT) layer 650, and an organic EL element layer 660 stacked in that order. The TFT layer 650 and the organic EL element layer 660 constitute an electronic device element layer 670. The plastic substrate 630, the sealing layer 640, and the electronic device element layer 670 (the TFT layer 650 and the organic EL element layer 660) constitute the electronic device 600.

Figure 28B:
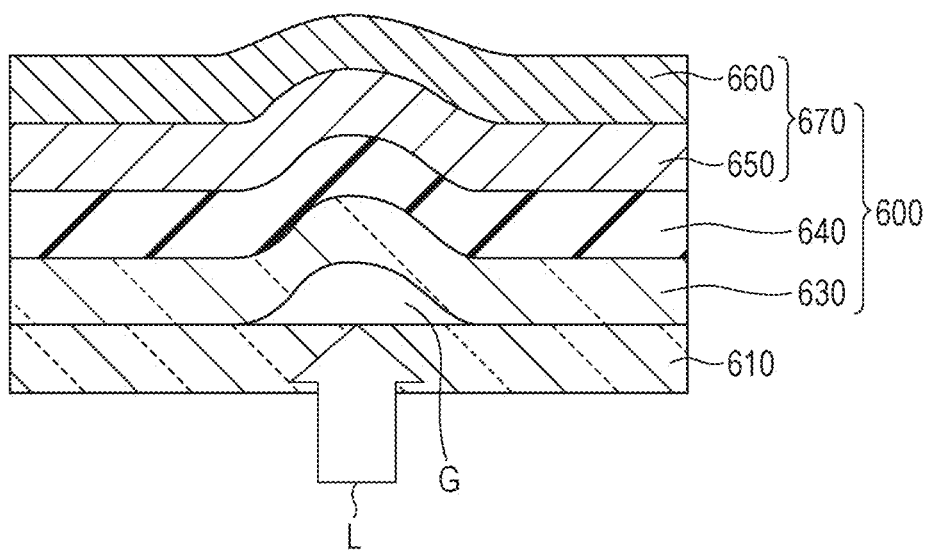
FIG. 28B is a partial cross-sectional view schematically illustrating a state in which the electronic device not according to the embodiment illustrated in FIG. 28A and the supporting substrate are irradiated with laser light.

In the case where an amorphous silicon layer is provided as described in Japanese Patent No. 3809681, laser irradiation generates hydrogen gas as described above. Even if an amorphous silicon layer is not provided, part of the plastic substrate 630 in close contact with the supporting substrate 610 is broken by laser irradiation, thereby generating a relatively-high-pressure gas by ablation or pyrolysis, in some cases. The gas generation causes mechanical tensile displacement between a portion where separation proceeds and an adjacent portion that remains in contact and at the interface between the supporting substrate 610 and the plastic substrate 630. The plastic substrate 630 has lower stiffness than that of the supporting substrate 610. Thus, the plastic substrate 630 is deformed so as to be lifted by the pressure of generated gas G as illustrated in FIG. 28B. The deformation of the plastic substrate 630 applies stress to the layers arranged on the plastic substrate 630 and the electronic device element, easily causing damage. In particular, the sealing layer 640 formed of a thin silicon nitride film, the TFT layer 650 including the electrode layer formed of a thin metal film, and so forth are susceptible to damage.

In a method for producing an electronic device, the method including forming an electronic device element on or above a plastic film arranged on a supporting substrate and then separating the supporting substrate, the inventors have conducted intensive studies in order to suppress damage to the device at the time of the separation of the supporting substrate.

In a method for producing an electronic device according to an aspect of the present disclosure, a porous layer is formed between a supporting substrate and a resin substrate. At least part of a region of the porous layer contains a plurality of pores containing a gas in internal spaces thereof. The gas is present in the pores, in other words, the pores have internal spaces; hence, in the at least part of the region, the porous layer has lower stiffness than that of the resin substrate. The porous layer is easily deformed and broken, compared with the resin substrate. Thus, the at least part of the porous layer is deformed and broken by the pressure of a gas generated from the resin substrate broken by ablation and so forth due to irradiation with laser light, so that the pressure of the gas is relieved, thus reducing stress imposed on the resin substrate. This suppresses damage to the electronic device element formed on or above the resin substrate.

In a laminated substrate according to another aspect of the present disclosure, for the same reason as above, it is possible to reduce stress imposed on the resin substrate. In the case where an electronic device element and so forth (e.g. the electronic device element and some components thereof) are formed on or above a resin substrate, it is possible to suppress damage to the electronic device element and so forth.

In a method for producing an electronic device according to an aspect of the present disclosure, a supporting substrate is prepared. A porous layer is formed on or above the supporting substrate, at least part of a region of the porous layer containing a plurality of pores containing a gas in their internal spaces. A resin substrate is formed on or above the porous layer. An electronic device element is formed on or above the resin substrate. Irradiation with laser light is performed from the supporting substrate side to separate the supporting substrate from the resin substrate.

In the production method, the at least part of the region of the porous layer contains the plurality of pores having internal spaces, so that the porous layer has lower stiffness than that of the resin substrate. The energy of the pressure of a gas possibly generated from the resin substrate at the time of the laser light irradiation is consumed to break the porous layer. This reduces stress on the resin substrate and suppresses the deformation of the resin substrate, thus suppressing damage to the electronic device element formed on or above the resin substrate.

The pores in a portion of the porous layer adjacent to the resin substrate may have a smaller average diameter than that of the pores in a portion of the porous layer adjacent to the supporting substrate.

Since the porous layer has the foregoing structure, when the resin substrate is formed on or above the porous layer, a resin material for the resin substrate is less likely to enter the pores whose inner surfaces are exposed at the main surface of the porous layer adjacent to the resin substrate. It is thus possible to maintain the internal spaces of the pores present in a surface layer portion on the side of the main surface and suppress an increase in the stiffness of the surface layer portion on the side of the main surface of the porous layer. This prevents the fact that the pressure of a gas generated at the time of the laser light irradiation causes difficulty in breaking the porous layer. It is thus possible to maintain the effect of reducing stress on the resin substrate.

Here, the pressure of the gas generated by the laser light irradiation is reduced by breaking the porous layer. In addition, the pressure is reduced by the distribution of the pressure to the gas present in the pores in the porous layer. In particular, when a plurality of pores communicate with each other, it is possible to obtain a higher effect of distributing pressure. Since the porous layer has the foregoing structure, the internal spaces of the pores present in the surface layer portion on the side of the main surface of the porous layer are maintained, thus maintaining the gas-pressure distributing effect.

The porous layer may include a first porous sublayer portion on the supporting substrate; and a second porous sublayer on the first porous sublayer. The pores in the second porous sublayer may have a smaller average diameter than that of the pores in the first porous sublayer.

In this case, a resin material for the resin substrate is less likely to enter the pores in the second porous sublayer located on the side on which the resin substrate is arranged. Thus, the internal spaces of the pores are maintained, thereby maintaining the effect of reducing stress on the resin substrate. Moreover, the effect of distributing the pressure of a gas generated at the time of laser light irradiation is maintained. The first porous sublayer having the pores with an average diameter larger than that of the second porous sublayer is arranged on a side of the second porous sublayer adjacent to the supporting substrate. This reduces the stiffness of the entire porous layer to suppress the deformation of the resin substrate.

The second porous sublayer may be formed by a dry process or thermal evaporation.

In the case where the second porous sublayer is formed by a wet process, water and a solvent is left. This causes the generation of a gas at the time of heating and laser irradiation in the subsequent production process. Since the second porous sublayer is formed by a dry process or thermal evaporation, water and a solvent is not left, thereby suppressing the generation of a gas.

The first porous sublayer may be formed by the application of a first resin material. The second porous sublayer may be formed by the application of a second resin material. The second resin material may have a higher viscosity than that of the first resin material.

In this case, when the second porous sublayer is formed on the first porous sublayer, the second resin material is less likely to enter the pores exposed at a main surface of the first porous sublayer on the side on which the second porous sublayer is formed, thus maintaining the internal spaces of the pores in the first porous sublayer. As a result, the entire porous layer has lower stiffness than that of the resin substrate.

In a state after the formation of the porous layer and before the formation of the resin substrate, some inner surfaces of the plurality of pores may be exposed at a surface serving as a main surface of the porous layer on the side on which the resin substrate is to be formed. Moreover, after the formation of the porous layer and before the formation of the resin substrate, the porous layer may be subjected to affinity treatment such that the affinity of the surface of the porous layer for a resin material used to form the resin substrate is higher than the affinity of a portion of the porous layer other than the surface.

In this case, when the resin substrate is formed by the application of the resin material on the porous layer, the resin material is less likely to enter the inside the pores exposed at the main surface of the porous layer on the side on which the resin substrate is formed. Thus, the internal spaces of the pores in the porous layer are maintained, thereby maintaining the effect of reducing stress on the resin substrate. Moreover, the effect of distributing the pressure of a gas generated at the time of laser light irradiation is maintained.

In the affinity treatment, after a thin film of a material is formed on the surface and the inner surfaces of the porous layer, the UV light irradiation or the plasma treatment may be performed from the side on which the resin substrate is to be formed. The material of the thin film have a lower affinity for the resin material than a material used to form the porous layer, and have properties in which the affinity after UV light irradiation or plasma treatment is higher than the affinity before the UV light irradiation or the plasma treatment.

The thin film may be formed by applying a solution containing a material to the surface and the exposed inner surfaces of the porous layer and performing drying. The material have a lower affinity for the resin material than the material used to form the porous layer, and have properties in which the affinity after UV light irradiation or plasma treatment is higher than the affinity before the UV light irradiation or the plasma treatment.

In this case, the affinity treatment is easily performed.

The pores in the portion of the porous layer adjacent to the resin substrate may have an average diameter of 1 μm or less.

In this case, when the resin substrate is formed on the porous layer, the resin material is less likely to enter the pores exposed at the main surface of the porous layer on the side on which the resin substrate is formed. Thus, the internal spaces of the pores in the portion of the porous layer adjacent to the resin substrate are maintained, thereby maintaining the effect of reducing stress on the resin substrate. Moreover, the effect of distributing the pressure of a gas generated at the time of laser light irradiation is maintained.

The pores in the second porous sublayer may have an average diameter of 1 μm or less.

In this case, when the resin substrate is formed on the second porous sublayer, the resin material is less likely to enter the pores exposed at the main surface of the second porous sublayer on the side on which the resin substrate is formed. Thus, the internal spaces of the pores in the portion of the second porous sublayer adjacent to the resin substrate are maintained, thereby maintaining the effect of reducing stress on the resin substrate. Moreover, the effect of distributing the pressure of a gas generated at the time of laser light irradiation is maintained.

The porous layer may include a coating thin layer portion free from the pores, the coating thin layer portion being arranged on a surface serving as a main surface of the porous layer on the side on which the resin substrate is formed. The coating thin layer portion may be composed of a material that is the same as that constituting a portion of the porous layer other than the coating thin layer portion.

In this case, when the resin substrate is formed on the porous layer, the resin material is blocked by the coating thin layer portion and does not enter the pores in the porous layer. Thus, the internal spaces of the pores in the porous layer are maintained, thereby maintaining the effect of reducing stress on the resin substrate. Moreover, the effect of distributing the pressure of a gas generated at the time of laser light irradiation is maintained. Furthermore, the coating thin layer portion is composed of a material that is the same as that constituting the portion of the porous layer other than the coating thin layer portion. Thus, increases in the number of steps and the types of materials are suppressed, leading to the suppression of an increase in production cost.

A laminated substrate according to another embodiment of the present disclosure includes a supporting substrate, a porous layer arranged on or above the supporting substrate, at least part of a region of the porous layer containing a plurality of pores containing a gas in internal spaces thereof, and a resin substrate arranged on or above the porous layer.

In the structure of the laminated substrate according to the another aspect of the present disclosure, the at least part of the region of the porous layer contains the plurality of pores having internal spaces, so that the porous layer has lower stiffness than that of the resin substrate. In the case where after an electronic device element and its component are partially formed, the supporting substrate is separated by irradiation with laser light from the supporting substrate side, the energy of the pressure of a gas possibly generated from the resin substrate at the time of the laser light irradiation is consumed to break the porous layer. This reduces stress on the resin substrate and suppresses the deformation of the resin substrate, thus suppressing damage to the electronic device element and so forth formed above the resin substrate.

The pores in a portion of the porous layer adjacent to the resin substrate may have a smaller average diameter than that of the pores in a portion of the porous layer adjacent to the supporting substrate.

Thus, when the resin substrate is formed on or above the porous layer, a resin material for the resin substrate is less likely to enter the pores whose inner surfaces are exposed at the main surface of the porous layer adjacent to the resin substrate. It is thus possible to maintain the internal spaces of the pores present in a surface layer portion on the side of the main surface and suppress an increase in the stiffness of the surface layer portion on the side of the main surface of the porous layer. This prevents the fact that the pressure of a gas generated at the time of the laser light irradiation causes difficulty in breaking the porous layer. It is thus possible to maintain the effect of reducing stress on the resin substrate.

The internal spaces of the pores present in the surface layer portion of the porous layer are maintained, so that the pressure of the gas generated by the laser irradiation is distributed to the gas present in the internal spaces of the pores. Stress due to the pressure of the gas on the resin substrate is thus reduced.

Embodiments and modifications thereof of the present disclosure will be specifically illustrated below. The structure, the effects, and the advantages will be described.

The embodiments and the modifications described below are merely examples to clearly illustrate the structures according to an aspect of the present disclosure and the effects and advantages thereof. The present disclosure is in no way limited to the following embodiments and modifications, except for its inessential features.

Second Embodiment

1. Structure of Electronic Device

The structure of an electronic device according to a second embodiment of the present disclosure will be described below with reference to FIGS. 14A, 14B, 15, and 16A to 16D by taking, as an example, an active-matrix organic EL display device for which the structure is used.

Figure 14A:
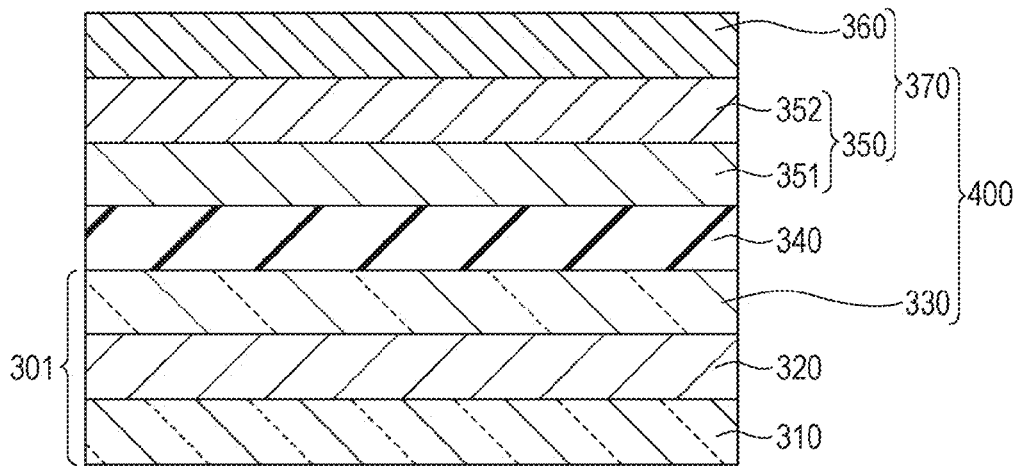
FIG. 14A is a partial cross-sectional view schematically illustrating a state in which an electronic device according to a second embodiment of the present disclosure is arranged on a supporting substrate.
Figure 14B:
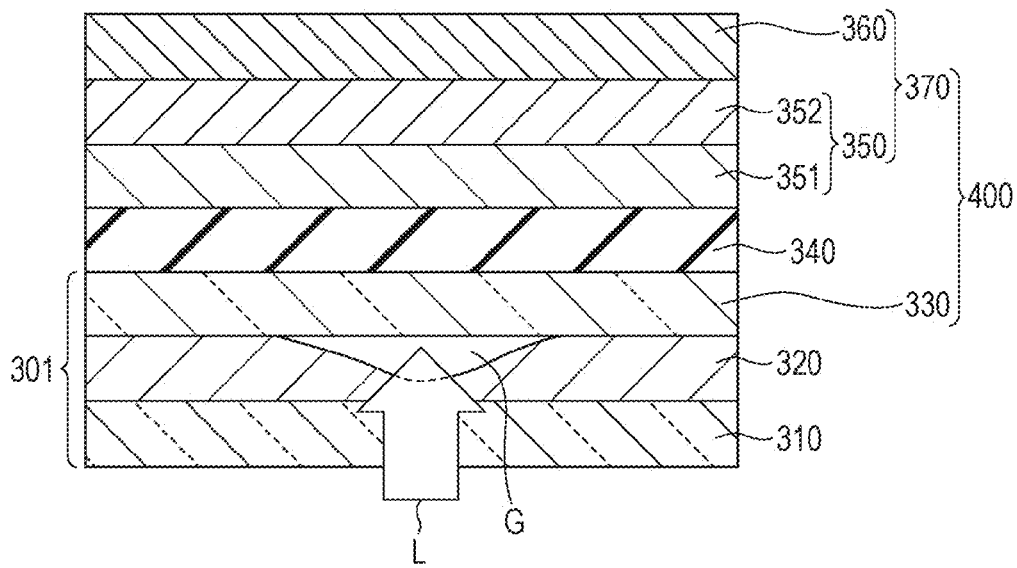
FIG. 14B is a partial cross-sectional view schematically illustrating a state in which the electronic device according to the embodiment and the supporting substrate illustrated in FIG. 14A are irradiated with laser light.

FIG. 14A is a partial cross-sectional view schematically illustrating the structure of an electron device body 4000 in which an electronic device 400 according to this embodiment is arranged on a supporting substrate 310. In this embodiment, the electronic device 400 is an active-matrix organic EL display device. FIG. 14B is a partial cross-sectional view schematically illustrating a state in which the electron device body 4000 is irradiated with laser light from the supporting substrate 310 side.

As illustrated in FIG. 14A, the electron device body 4000 includes the supporting substrate 310, a porous layer 320, a plastic substrate (or resin substrate) 330, a sealing layer 340, a TFT layer 350, and an organic EL element layer 360 stacked in that order. The TFT layer 350 and the organic EL element layer 360 constitute an electronic device element layer (electronic device element) 370. The plastic substrate 330, the sealing layer 340, the TFT layer 350, and the organic EL element layer 360 constitute the electronic device 400 according to this embodiment. The supporting substrate 310, the porous layer 320, and the plastic substrate 330 constitute a laminated substrate 301 according to this embodiment.

Supporting Substrate

Examples of a material for the supporting substrate 310 include, but are not particularly limited to, glass materials, such as alkali-free glass (borosilicate glass), alkali glass, soda glass, non-fluorescent glass, phosphate-based glass, borate glass, and silica; and insulating materials, such as alumina.

A surface of the supporting substrate 310 (i.e. a main surface of the supporting substrate 310 on the side on which the electronic device 400 is to be formed) desirably has a high degree of flatness because a thin-film device element, such as a display device element, is formed after the temporal fixation of the plastic substrate 330. Specifically, the surface has a maximum level difference of 10 μm or less and desirably 1 μm or less.

The surface of the supporting substrate 310 is desirably in a clean state in order to achieve good adhesion to a layer to be formed thereon. As a method for cleaning the surface, for example, UV light irradiation, ozone treatment, plasma treatment, or hydrofluoric acid treatment may be employed. A single layer configured to improve adhesion to a layer to be formed thereon may be formed on a surface of the supporting substrate 310. As the layer configured to improve adhesion, for example, a silicon oxide film may be used.

Porous Layer

Figure 15:
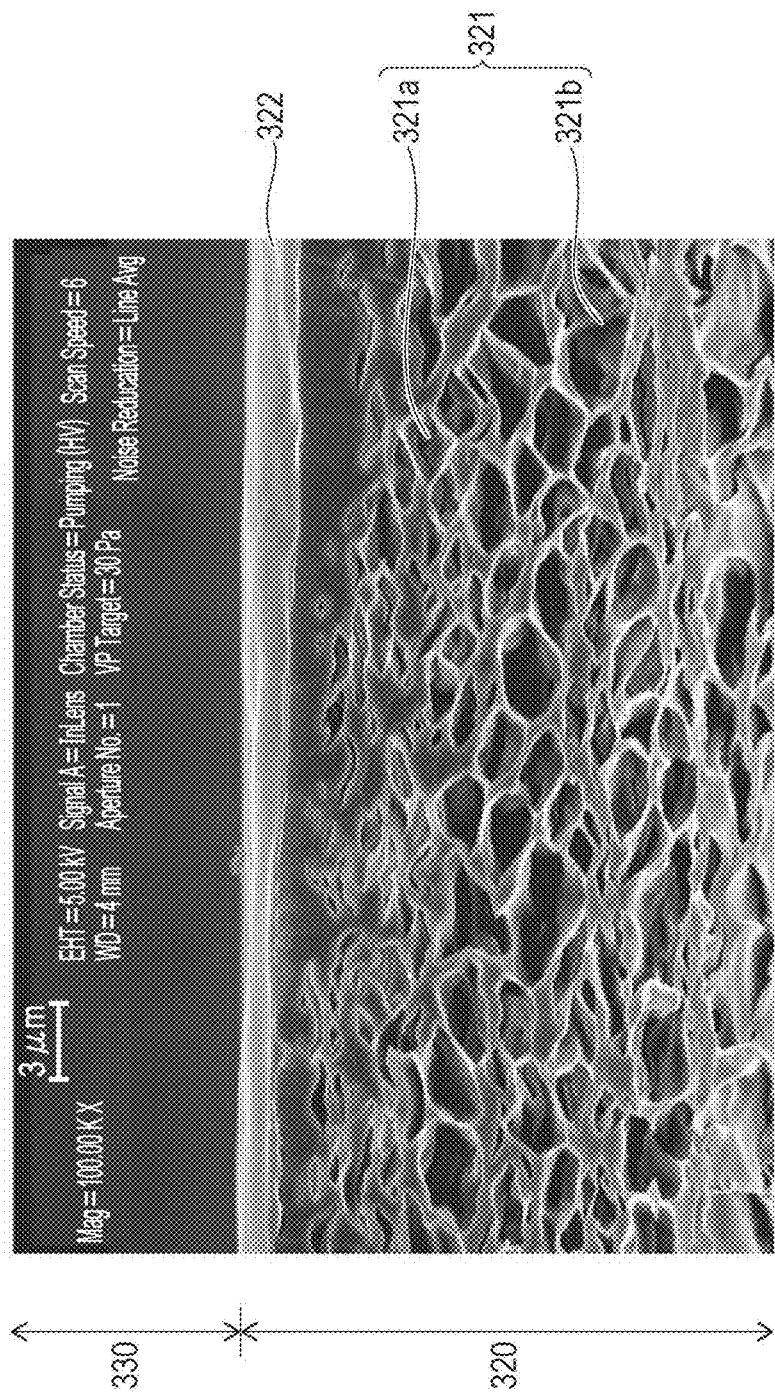
FIG. 15 is a photomicrograph of a cross section of a porous layer and a plastic substrate of the electronic device according to the embodiment.

As illustrated in FIG. 15, the porous layer 320 has many pores therein. FIG. 15 is a scanning electron photomicrograph of a cross section of a portion in the vicinity of the interface between the porous layer 320 and the plastic substrate 330.

The term "pores" indicates that not all of the internal spaces are filled with a liquid or a solid and that a gas, for example, air or a vaporized solvent, is present. A liquid, for example, water or a solvent, or solid foreign matter, such as dust, may be present in the internal spaces in addition to the gas. However, even in this case, 50% or more of the volume of each of the internal spaces is desirably filled with a gas.

The porosity of the porous layer 320 is higher than at least the porosity of the plastic substrate 330. The stiffness of at least part of the porous layer 320 is lower than the stiffness of the plastic substrate 330.

Here, the term "pores" are not limited to cell-like pores having completely closed internal spaces and is used as a concept including pores in which part of a cell-defining wall is absent, pores in which a defective portion of a wall is exposed at the outside, and pores in which the internal spaces of a plurality of cells communicate with each other.

Furthermore, the term "pores" used here indicates pores each having a diameter of, for example, 10 nm or more and 10 μm or less, and desirably 100 nm or more and 5 μm or less. In the case where a plurality of pores communicate with each other, each of the pores may have a diameter within the above range.

Here, the diameter of each of the pores indicates the length of the internal space of each pore in the direction to which a layer extends (i.e. direction perpendicular to the thickness direction of the layer).

Specifically, the porous layer 320 desirably has a porosity of, for example, 10% or more and 90% or less.

More desirably, the porous layer 320 may have a porosity of 50% or more and 90% or less. A porosity of 50% or more results in an increase in the proportion of the porous layer broken upon separating the supporting substrate with a laser, thereby resulting in a reduction in pressure applied to the plastic substrate. At a porosity of 90% or less, the porous layer 320 ensures mechanical strength to a certain degree. For example, it is possible to suppress breakage due to mechanical stress caused by, for example, a reduction or an increase in pressure at the time of vacuum deposition in a production process. Specifically, the breakage due to mechanical stress indicates the delamination of a film and so forth. At an excessively high porosity, when the plastic substrate 330 is formed with a resin material (for example, polyimide), the resin material enters the pores, increasing the strength of the porous layer 320. Thus, the porous layer 320 desirably has a porosity of about 90% or less.

As a method for measuring the porosity of the porous layer 320, there is a method as described below. For example, a cross section of the porous layer 320 is formed by mechanical cutting or focused ion beam micromachining. The cross section is observed with a scanning electron microscope. The ratio of pores at the cross section to the division wall defining the pores is calculated. It is easily assumed that a comparable ratio is obtained in another cross section. Thus, the ratio is determined as a volume ratio and may be defined as the porosity. Furthermore, the measurement is performed at a plurality of points in the cross section. It is possible to increase the accuracy by averaging the resulting values of the porosity.

As the material for the porous layer 320, an organic material may be used.

Examples of a method for forming the porous layer 320 include, but are not particularly limited to, a wet formation method and a dry formation method. A temperature during a step of forming the porous layer 320 or a heating temperature after the formation of the porous layer 320 is desirably higher than a temperature in a step of forming each layer formed thereon. The reason for this is that when the steps of forming the upper layers are performed at a higher temperature than the formation temperature of the porous layer 320, the porous layer 320 is likely to change, which is not desirable. For example, water, a solvent, and a gas adsorbed in the pores or on a solid portion of the porous layer 320 may be desorbed at the time of the formation steps of the upper layers, causing a failure, such as separation from the upper layer.

The thickness of the porous layer 320 is desirably, but not particularly limited to, about 1 μm to about 1000 μm.

In this embodiment, as illustrated in FIG. 15, the porous layer 320 includes a coating thin layer portion 322 on the surface of the porous layer 320 adjacent to the plastic substrate 330, the coating thin layer portion 322 having a thickness of about 1 μm and being free from a pore. Since the coating thin layer portion 322 is arranged, when a resin material used to form the plastic substrate 330 is applied to the porous layer 320, the resin material does not enter the pores, so that the internal spaces of the pores are not filled with the resin material. This satisfactorily maintains the gas-pressure-relief effect of the porous layer 320.

The term "resin material" used here includes resin polymers and solvents. The resin polymers and the solvents each may be used in combination as a mixture of two or more types thereof.

In the formation process of the porous layer 320, when a resin material used to form the porous layer 320 is heated, a solvent in the resin material seemingly bubbles to form pores. At this time, bubbles near a surface can be relatively easily moved from the surface to the air. The bubbles seemingly disappear in near the surface as time passes, thereby forming the coating thin layer portion 322.

Plastic Substrate

Examples of a material for the plastic substrate 330 include, but are not particularly limited to, polyethylene, polypropylene, polyvinylene, polyvinylidene chloride, polyethylene terephthalate, polyethylene naphthalate, polycarbonate, polyethylene sulfonic acid, silicone, acrylic resins, epoxy resins, phenolic resins, polyamide, polyimide, and aramid resins. These materials may be used in combination as a mixture of two or more thereof. These materials may be chemically modified. Two or more of these materials may be combined to form a laminated film having a multilayer structure.

The plastic substrate 330 is required to have the characteristics in which the plastic substrate 330 is not easily cracked or broken when curved. If the plastic substrate 330 does not have the characteristics, it is impossible to provide a display device with high flexibility.

The thickness of the plastic substrate 330 is desirably in the range of 1 µm to 1000 µm. At a thickness smaller than the range, mechanical strength is not ensured. At a thickness larger than the range, the substrate is difficult to bend, thus failing to provide a display device with high flexibility.

Regarding a method for forming the plastic substrate 330, the plastic substrate 330 may be formed by the application of a liquid resin material. A film-shaped material may be press-bonded, without any limitation. When the film-shaped material is press-bonded, an adhesive layer may be formed between the film and the porous layer. The adhesive layer is not particularly limited as long as a desired adhesive force is provided. Examples of the adhesive layer include silicone-based adhesive layers and acrylic-based adhesive layers. The plastic substrate 330 may be the transparent substrate 30 described above.

Sealing Layer

The sealing layer 340 may be formed of, for example, a silicon nitride film.

TFT Layer

The TFT layer 350 includes a TFT configured to drive an organic EL element. The TFT layer 350 includes an electrode layer 351 formed of a gate electrode included in the TFT, and a TFT main body layer 352 constituting a portion of the TFT except the gate electrode.

The electrode layer 351 is formed by depositing a metal material by a vacuum evaporation method or a sputtering method and selectively removing the resulting metal material film by, for example, etching. Examples of a material for the electrode layer 351 include silver, aluminum, alloys of silver, palladium, and copper, and alloys of silver, rubidium, and gold.

The TFT main body layer 352 includes, for example, a gate-insulating film, source-drain electrodes, a bank, a semiconductor layer, and a passivation film. Examples of the TFT that may be used include a TFT whose channel material is silicon, a TFT whose channel material is an oxide semiconductor, such as an indium-gallium-zinc oxide, and a TFT whose channel material is an organic semiconductor, such as pentacene.

Organic EL Element Layer

The organic EL element layer 360 includes a cathode, an anode, and a light-emitting layer arranged between the cathode and the anode. The organic EL element layer 360 may further include an electron injection layer, an electron transport layer, a hole injection layer, a hole transport layer, a partition layer, a sealing layer, and so forth. The organic EL element layer 360 may still further include a color filter and a protective filter.

The TFT layer 350 and the organic EL element layer 360 constitute the electronic device element layer 370.

In this embodiment, the TFT layer 350 has a multilayer structure including the electrode layer 351 and the TFT main body layer 352. However, the TFT layer 350 is not limited to the structure. For example, in the case where the electronic device 400 is a passive-matrix organic EL display device, a wiring layer corresponds to the TFT layer 350.

In the case where the electronic device 400 is a liquid crystal display device, LCD elements are arranged in the display device element layer 370. In the case where the electronic device 400 is a photosensor, a photoelectric conversion element is arranged in the electronic device element layer 370.

2. Separation Between the Electronic Device and the Supporting Substrate

To separate the electronic device 400 from the supporting substrate 310, irradiation with laser light is performed from the supporting substrate 310 side. Thereby, part of the porous layer 320 is broken at the interface between the supporting substrate 310 and the porous layer 320, at the inside of the porous layer 320, or at the interface between the porous layer 320 and the plastic substrate 330, thus separating the electronic device 400 from the supporting substrate 310.

In the case of the electron device body 9000 which is not according to this embodiment and which is illustrated in FIG. 28A, a plastic substrate 630 is arranged on the supporting substrate 610. The mechanical stress due to laser irradiation is not relieved, so that the plastic substrate 630 is markedly deformed as illustrated in FIG. 28B. Specifically, the deformation of the plastic substrate 630 is elongation. The rate of change is expressed as $[(d+\Delta d)/d]^{-1}$, where d represents an elongation state before the laser irradiation, and d+$\Delta$d represents an elongation state after the laser irradiation. For example, in the case of a plastic substrate including an inorganic silicon nitride film generally used as a sealing film, the marginal rate of change, at which a barrier is broken, is in the range of about 0.5% to about 1.0%. This reveals that even a minute change causes damage to the upper layers. The cause of the deformation is as follows: When the plastic substrate 630 absorbs the energy of the laser light to cause ablation, a high-pressure gas is generated. However, the pressure cannot escape through the supporting substrate 610; hence, the energy is consumed to deform the plastic substrate 630.

In contrast, in the method for producing an electronic device according to this embodiment, the porous layer 320 is formed between the supporting substrate 310 and the plastic substrate 330.

The porous layer 320 has a shape containing the pores therein and has lower stiffness than that of the supporting substrate 310 and the plastic substrate 330. Thus, as illustrated in FIG. 14B, the energy of high-pressure gas G generated by ablation or pyrolysis due to laser irradiation is consumed by the break and deformation of the porous layer 320. Moreover, the pressure is relieved by the internal spaces of the porous layer 320. Thereby, the deformation of the plastic substrate 330 is suppressed. Furthermore, the deformation of the layers arranged above the plastic substrate 330 is also suppressed.

In the case where a plurality of pores communicate with each other, a gas generated from the resin substrate is dispersed in the plural pores communicating with each other to relieve the pressure. This also reduces stress on the resin substrate.

In addition, the break of the mechanically fragile porous layer 320 causes a loss of the bonding force between atoms or molecules in the porous layer 320, or the bonding force between the plastic substrate 330 and the porous layer 320, thereby stably and easily separating the plastic substrate 330 from the supporting substrate 310.

In the case where the porous layer 320 is arranged, it is possible to suppress the deformation of the plastic substrate 330 even when the intensity of laser light is increased in order to improve the efficiency of a separation process. The porous layer 320 is susceptible to mechanical breakage. Thus, the area ratio that maintains adhesion is low, so that the separation process is stably performed.

As has been described above, the use of the structure according to the embodiment of an aspect of the present disclosure suppresses (or reduces) damage to the electronic device at the time of the separation of the supporting substrate. Furthermore, it is possible to easily and stably perform the separation of the supporting substrate 310.

3. Method for Producing Electronic Device

Figure 19:
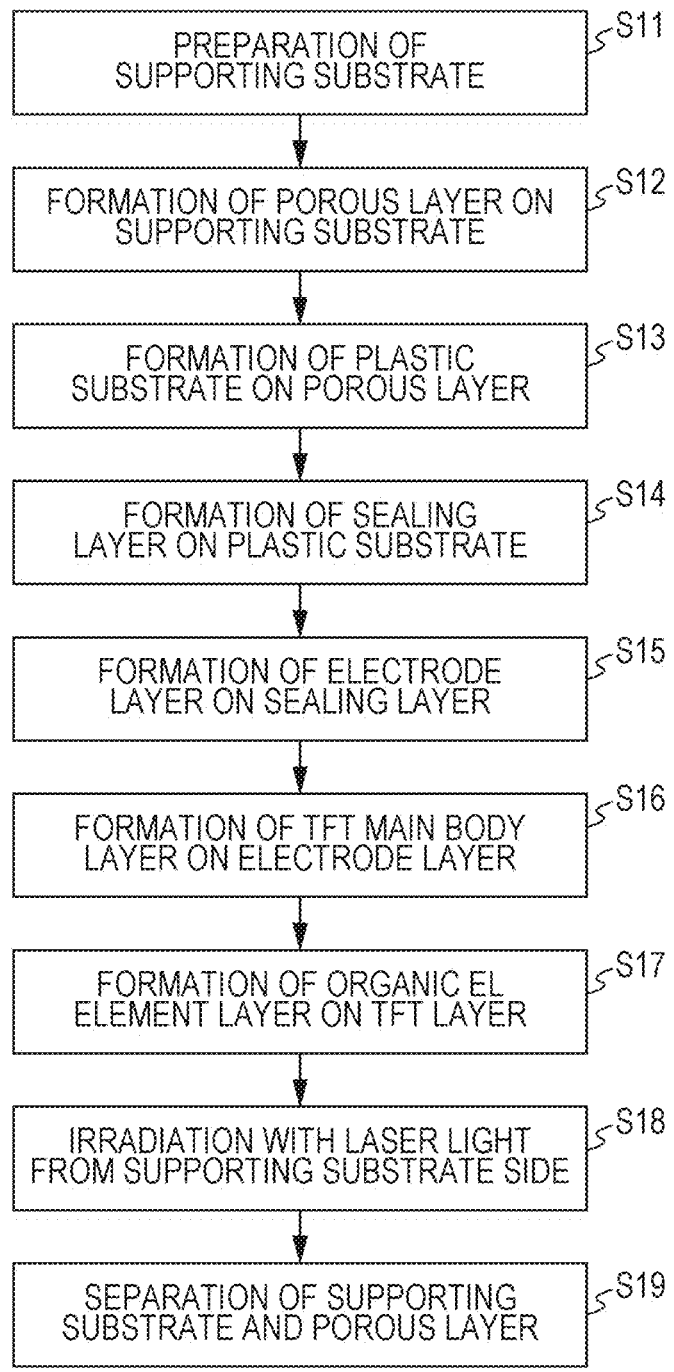
FIG. 19 is a schematic flow chart of the procedure for producing the electronic device according to the embodiment.

A method for producing an electronic device according to an embodiment of an aspect of the present disclosure will be described below with reference to FIGS. 16A to 16D, 17A to 17C, 18A, 18B, and 19. FIGS. 16A to 16D, 17A to 17C, 18A, and 18B are partial cross-sectional views schematically illustrating some steps in a procedure for producing the electronic device 400 according to the embodiment. FIG. 19 is a schematic flow chart of the procedure for producing the electronic device 400 according to the embodiment.

Figure 16A:
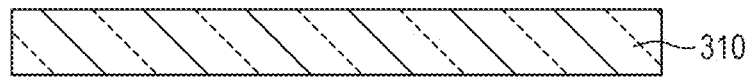
FIGS. 16A to 16D are partial cross-sectional views schematically illustrating some steps in a procedure for producing the electronic device according to the embodiment.

As illustrated in FIG. 16A, the supporting substrate 310 is prepared (step S11 in FIG. 19). The supporting substrate 310 is subjected to excimer UV (wavelength: 172 nm) treatment to clean the surface.

Figure 16B:
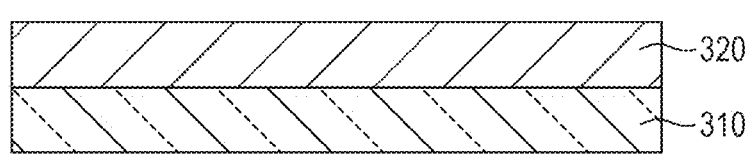

As illustrated in FIG. 16B, the porous layer 320 is formed on the supporting substrate 310 (step S12 in FIG. 19).

Figure 16C:
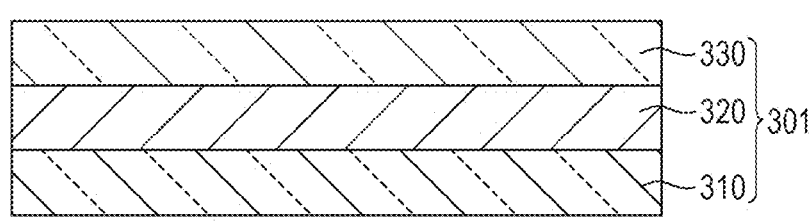

As illustrated in FIG. 16C, the plastic substrate 330 serving as a substrate for a flexible display is formed on the porous layer 320 (step S13 in FIG. 19). Thereby, the laminated substrate 301 is provided.

Figure 16D:
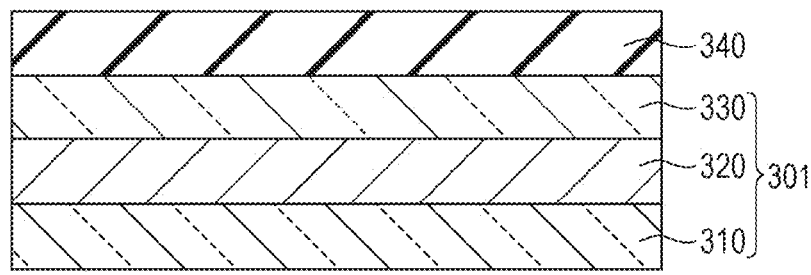

As illustrated in FIG. 16D, the sealing layer 340 is formed on the plastic substrate 330 (step S14 in FIG. 19).

Figure 17A:
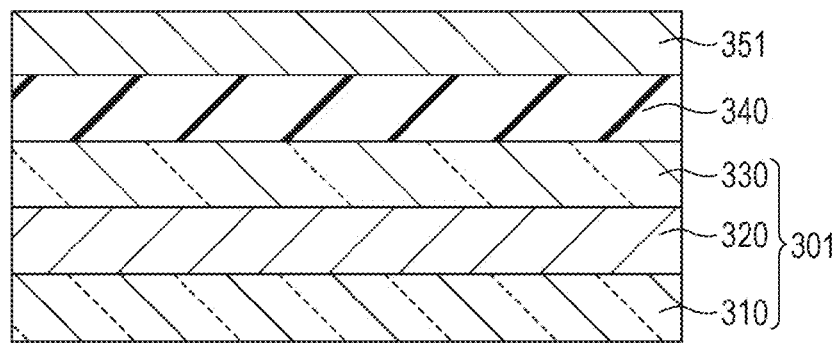
FIGS. 17A to 17C are partial cross-sectional views schematically illustrating some steps in the procedure for producing the electronic device continued from FIG. 16D.

As illustrated in FIG. 17A, a thin metal film is formed on the sealing layer 340 and then is subjected to etching treatment, thereby forming the electrode layer 351 (step S15 in FIG. 19).

Figure 17B:
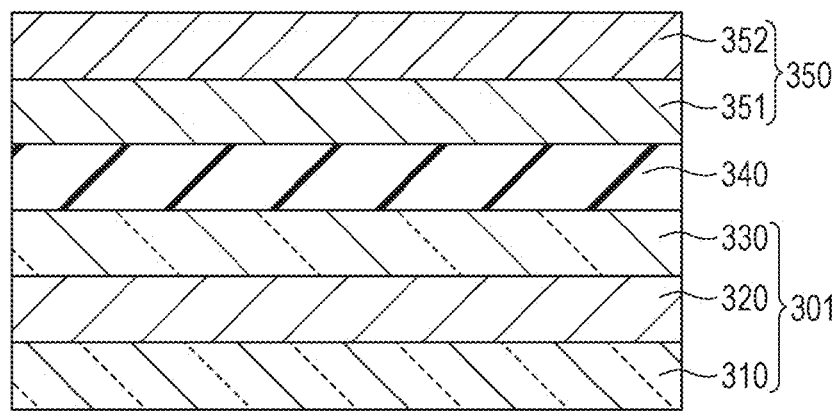

As illustrated in FIG. 17B, the TFT main body layer 352 is formed on the electrode layer 351, thereby completing the TFT layer 350 (step S16 in FIG. 19). In the case where a passive-matrix display is formed, the TFT layer need not be formed. A wiring layer alone will suffice.

Figure 17C:
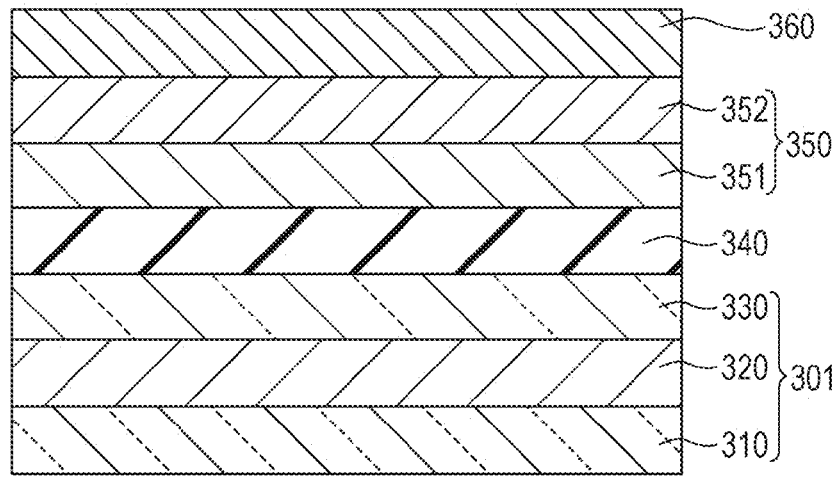

As illustrated in FIG. 17C, the organic EL element layer 360 is formed on the TFT layer 350 (step S17 in FIG. 19). Thereby, the electron device body 4000 is provided.

As illustrated in FIG. 18A, the electron device body 4000 is irradiated with laser light from the supporting substrate 310 side (step S18 in FIG. 19).

The supporting substrate 310 and the porous layer 320 are separated from the plastic substrate 330 by the laser irradiation, thereby providing the electronic device 400 (step S19 in FIG. 19).

After the separation of the supporting substrate 310 and the porous layer 320, part of the porous layer 320 may be attached to the plastic substrate 330.

4. Damage-Suppressing Effect

A verification test was performed to prove the effect of suppressing damage to the electronic device in a method for producing an electronic device according to an embodiment of an aspect of the present disclosure. The verification test was performed using two types of test pieces TP1 and TP2, which had the porous layers 320 with different thicknesses, and, as a comparative example, test piece TP3, which was free from the porous layer 320. In each of test pieces TP1, TP2, and TP3, the TFT main body layer 352 and the organic EL element layer 360 were not formed. The verification test was performed by subjecting test pieces TP1, TP2, and TP3 to laser irradiation and observing and measuring the surface state of the electrode layer 351.

Test Piece TP1

A specific method for producing test piece TP1 and production conditions will be described below.

The supporting substrate 310 was prepared (FIG. 16A, step S11 in FIG. 19). As the supporting substrate 310, EAzLE 2000, manufactured by Corning Incorporated, was used. A surface of the supporting substrate 310 was subjected to excimer UV (wavelength: 172 nm) treatment to clean the surface.

A polyimide was applied to the supporting substrate 310 by a spin coating method. The applied polyimide was heated at a heating temperature of 400° C. for 8 hours, thereby forming a 18-μm-thick porous polyimide layer serving as the porous layer 320 (FIG. 16B, step S12 in FIG. 19). Regarding the polyimide used as a material for the porous layer 320, specifically, U Imide Varnish Type BP manufactured by Unitika Limited was used.

A polyimide layer having a thickness of 30 μm was formed by a spin coating method on the porous layer 320, thereby forming the plastic substrate 330 serving as a substrate for a flexible display (FIG. 16C, step S13 in FIG. 19). Regarding the polyimide used as a material for the plastic substrate 330, specifically, U-Varnish manufactured by Ube Industries, Ltd. was used.

A 1-μm-thick silicon nitride film serving as the sealing layer 340 was formed on the plastic substrate 330 by capacitively coupled plasma-enhanced CVD at 300° C. (FIG. 16D, step S14 in FIG. 19).

Figure 20A:
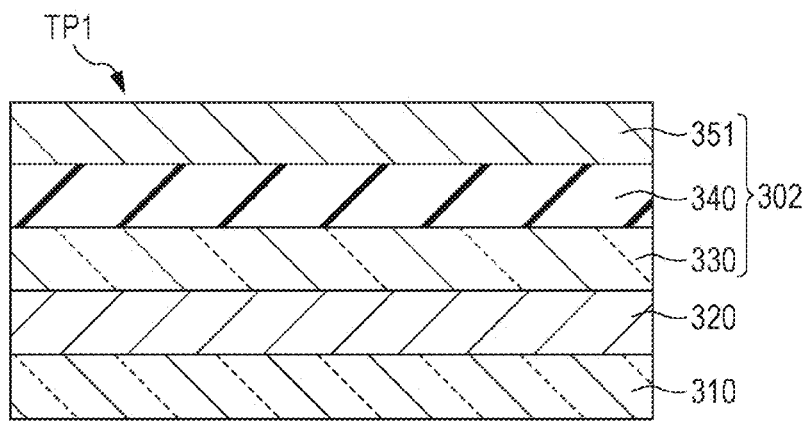
FIG. 20A is a partial cross-sectional view schematically illustrating the structure of test piece TP1.

A 100-nm-thick layer composed of an alloy of molybdenum and tungsten was formed on the sealing layer 340 by a sputtering method. The layer was patterned by a photolithography method with a resist and then subjected to etching treatment with a liquid mixture of phosphoric acid, nitric acid, and acetic acid, thereby forming the electrode layer 351 (FIG. 17A, step S15 in FIG. 19). In this way, test piece TP1 was produced. A schematic cross-sectional view of test piece TP1 is illustrated in FIG. 20A.

Test Piece TP2

Figure 20B:
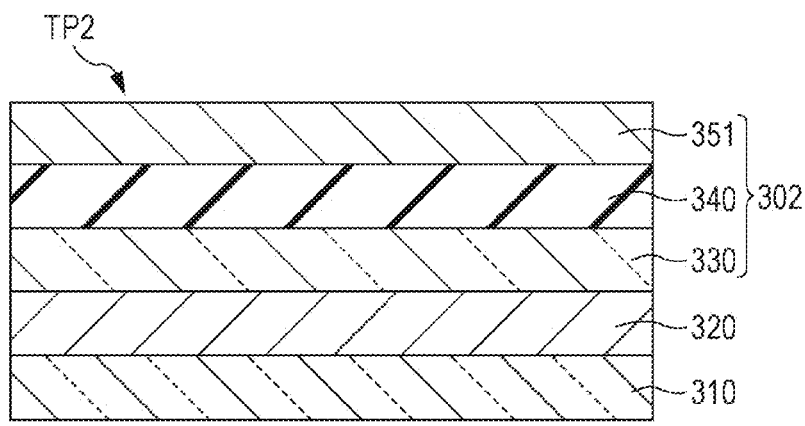
FIG. 20B is a partial cross-sectional view schematically illustrating the structure of test piece TP2.

Test piece TP2 was produced in the same procedure as test piece TP1, except that a 117-μm-thick porous polyimide serving as the porous layer 320 was formed at a reduced spin-coating speed. A schematic cross-sectional view of test piece TP2 is illustrated in FIG. 20B.

Test Piece TP3

Figure 20C:
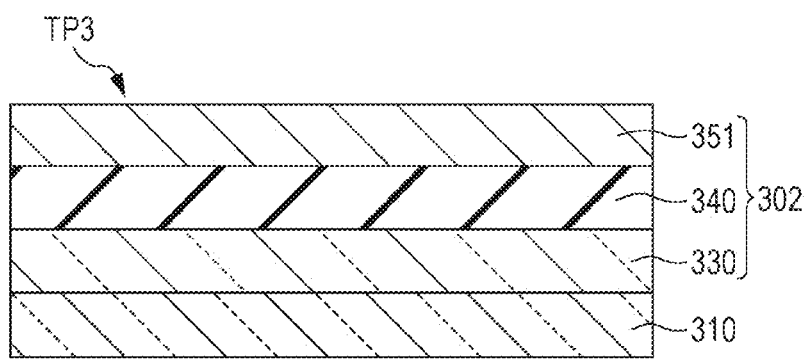
FIG. 20C is a partial cross-sectional view schematically illustrating the structure of test piece TP3.

Test piece TP3, as a comparative example, was produced in the same procedure as test piece TP1, except that the porous layer 320 was not formed. A schematic cross-sectional view of test piece TP3 is illustrated in FIG. 20C.

At least four specimens for each of test pieces TP1, TP2, and TP3 was prepared. Each of test pieces TP1, TP2, and TP3 was irradiated with laser light at four different laser irradiation power densities to separate a film 302 including the plastic substrate 330, the sealing layer 340, and the electrode layer 351 from the supporting substrate 310 (and the porous layer 320). Three evaluations described below were made for each test piece. The laser irradiation was performed by irradiation with excimer laser light having a wavelength of 305 nm, a pulse width per pulse of 20 ns, and an irradiation area of 20.0 mm×1.0 mm from the supporting substrate 310 while the excimer laser light is swept.

(1) Whether the plastic substrate 330 could be separated from the supporting substrate 310 was evaluated. When the separation could be performed with bare hands with little resistance, the specimen was rated as separable. In the case where the separation with bare hands is difficult to perform because of high adhesion between the film 302 and the supporting substrate 310, a technique for the separation by the application of a force with a roller or the like is conceivable. However, when a force is applied, the plastic substrate 330 is deformed to cause damage to the sealing layer 340 and the electrode layer 351 arranged as upper layers, which is undesirable.

(2) The laser irradiation was repeated until the separation could be performed with bare hands with little resistance at each laser irradiation power density. The number of repetitions of the irradiation was evaluated as an index of the process speed.

(3) After the separation of the supporting substrate 310, a surface of the electrode layer 351 was observed with a microscope to inspect the electrode layer 351 for defects, such as cracking.

FIG. 21 illustrates the results of the three evaluations.

In test piece TP3, when the laser irradiation energy density was 140 mJ/cm$^2$, the laser power was excessively low and did not reach a threshold of energy density required for the ablation of the polyimide. Thus, increasing the number of repetitions of the irradiation failed to perform the separation. When the laser irradiation energy density was 180 mJ/cm$^2$ or more, the following results were observed: a high-pressure gas (decomposition product of the polyimide) was generated by ablation due to the laser irradiation to deform the plastic substrate 330, causing damage to the electrode layer 351 composed of the molybdenum-tungsten alloy arranged on the plastic substrate 330.

Figure 22A:
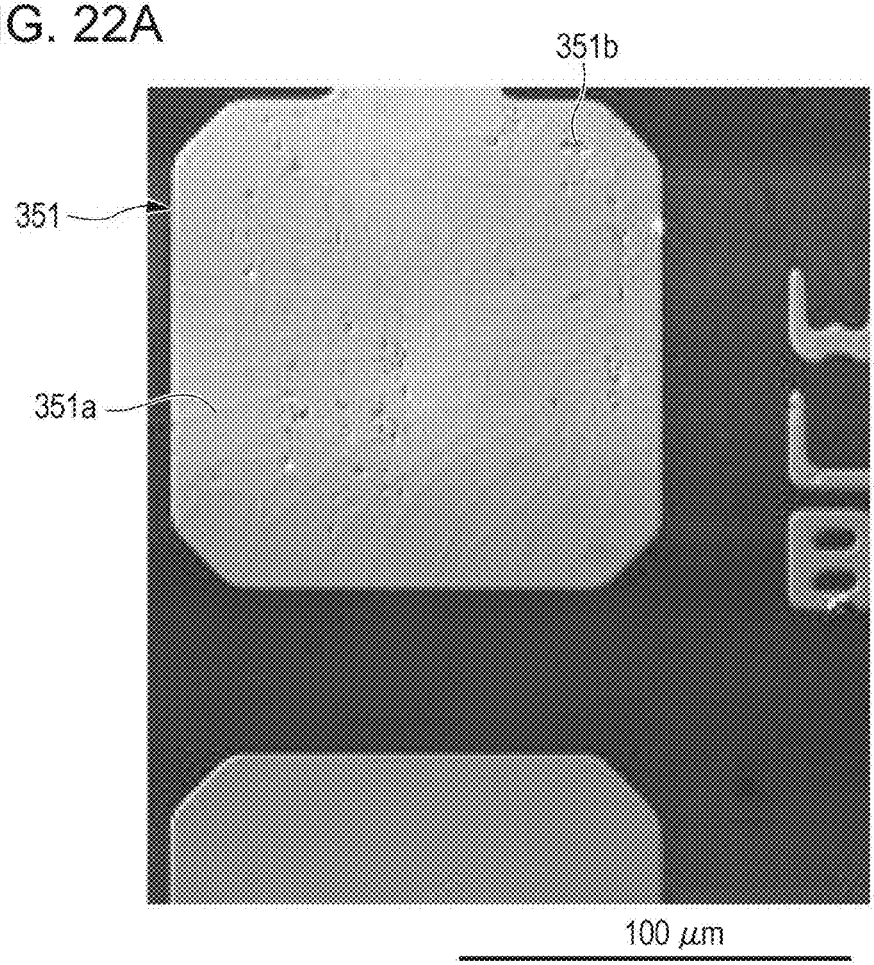
FIG. 22A is a photomicrograph of an electrode layer in an electronic device not according to the embodiment after laser irradiation.
Figure 22B:
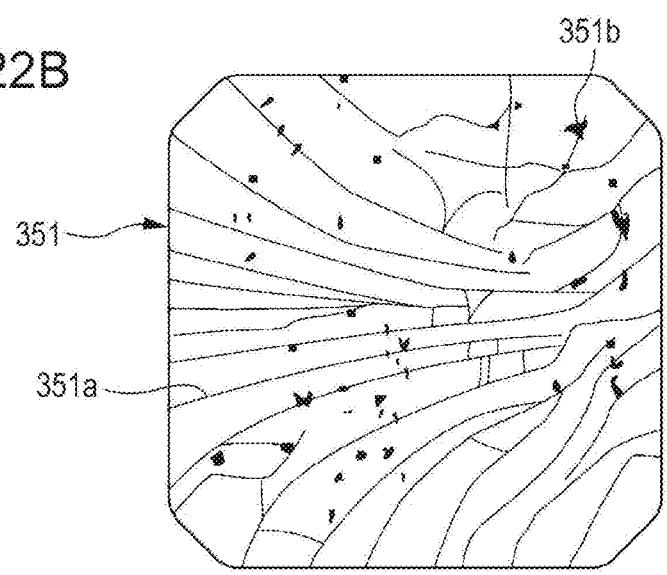
FIG. 22B schematically illustrates a surface state of the electrode layer illustrated in FIG. 22A.

FIG. 22A is a photomicrograph of a surface of the electrode layer 351 of test piece TP3 after the laser irradiation. FIG. 22B is a schematic view of the state of the surface of the electrode layer 351 of the photomicrograph in FIG. 22A, for simplicity's sake. As illustrated in FIGS. 22A and 22B, streaky portions 351a that look like leaf-vein-shaped cracks and point-defect portions 351b that look like through-holes or recessed portions were observed on the surface of the electrode layer 351 of test piece TP3 after the laser irradiation.

The sealing layer 340 arranged below the electrode layer 351 is seemingly deformed with the deformation of the plastic substrate 330, thereby breaking the electrode layer 351 arranged on the sealing layer 340. In test piece TP3 that did not include the porous layer 320, when the laser irradiation energy density was 160 mJ/cm$^2$, conditions under which the separation was made and electrode cracking did not occur were obtained. In the conditions, however, it is necessary to perform 20 or more laser irradiation operations in order to stably perform the separation with bare hands. For example, in the case of a process with a fourth-generation large-area glass substrate, it takes a long time of 5 or more hours to subject the entire surface to laser treatment, which is impractical in terms of production efficiency.

Here, as illustrated in FIG. 15, in the porous layer 320 according to the embodiment, the diameters of pores 321a in a portion near the plastic substrate 330 are generally smaller than those of pores 321b in a portion further away from the plastic substrate 330 (portion adjacent to the supporting substrate 310). In other words, the average diameter of the pores 321a is smaller than the average diameter of the pores 321b. The term "average diameter" may be represented by an average diameter obtained in an area of 10×10 μm$^2$. For example, the average diameter may be represented by an average diameter obtained by the observation of two or three points in a cross section of the porous layer 320 with a focused ion beam (FIB) scanning electron microscope (SEM).

The results of the laser separation on test pieces TP1 and TP2 illustrated in FIG. 21 reveal two features, compared with test piece TP3 not including the porous layer 320. First, no cracks were observed in the electrode layer 351 at the high-energy densities (180 and 200 mJ/cm$^2$). The reason for this is that the advantageous effects of the present disclosure were provided, in other words, the energy of a gas generated by ablation or pyrolysis due to laser irradiation was consumed to break the porous layer 320 without being used for the deformation of a portion on the plastic substrate 330 side. Furthermore, a lower region of the porous layer 320 (i.e. region adjacent to the supporting substrate 310) has high porosity because the pores in the region have large diameters; hence, stress due to the gas generated from the plastic substrate 330 is more likely to be absorbed in the porous layer 320.

Figure 23A:
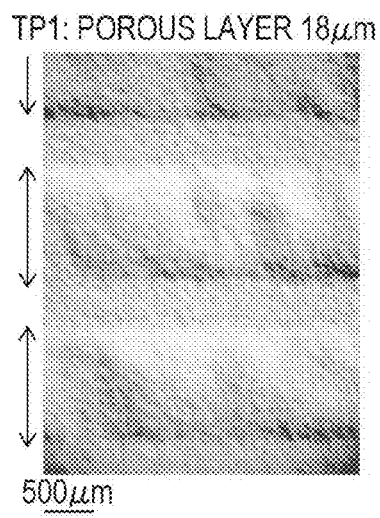
FIG. 23A is a photomicrograph of test piece TP1 after laser irradiation.
Figure 23B:
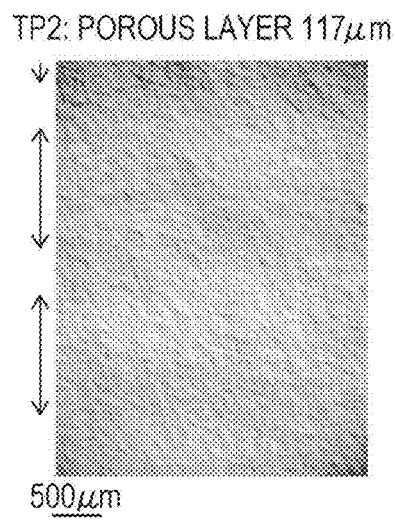
FIG. 23B is a photomicrograph of test piece TP2 after laser irradiation.
Figure 23C:
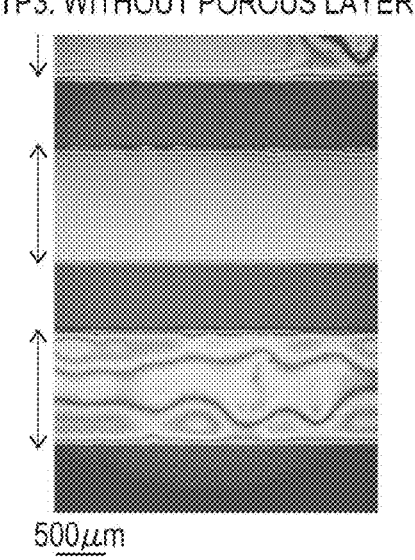
FIG. 23C is a photomicrograph of test piece TP3 after laser irradiation.

FIGS. 23A, 23B, and 23C are photomicrographs of the surfaces of the electrode layers 351 of test pieces TP1, TP2, and TP3 after laser irradiation at an energy density of 180 mJ/cm$^2$. To further clarify the influence of the laser irradiation, these photomicrographs were taken after the laser irradiation had been intentionally performed not on the entire surface but on linear regions. In FIGS. 23A, 23B, and 23C, ranges indicated by arrows show ranges that have been irradiated with laser light.

Figure 24:
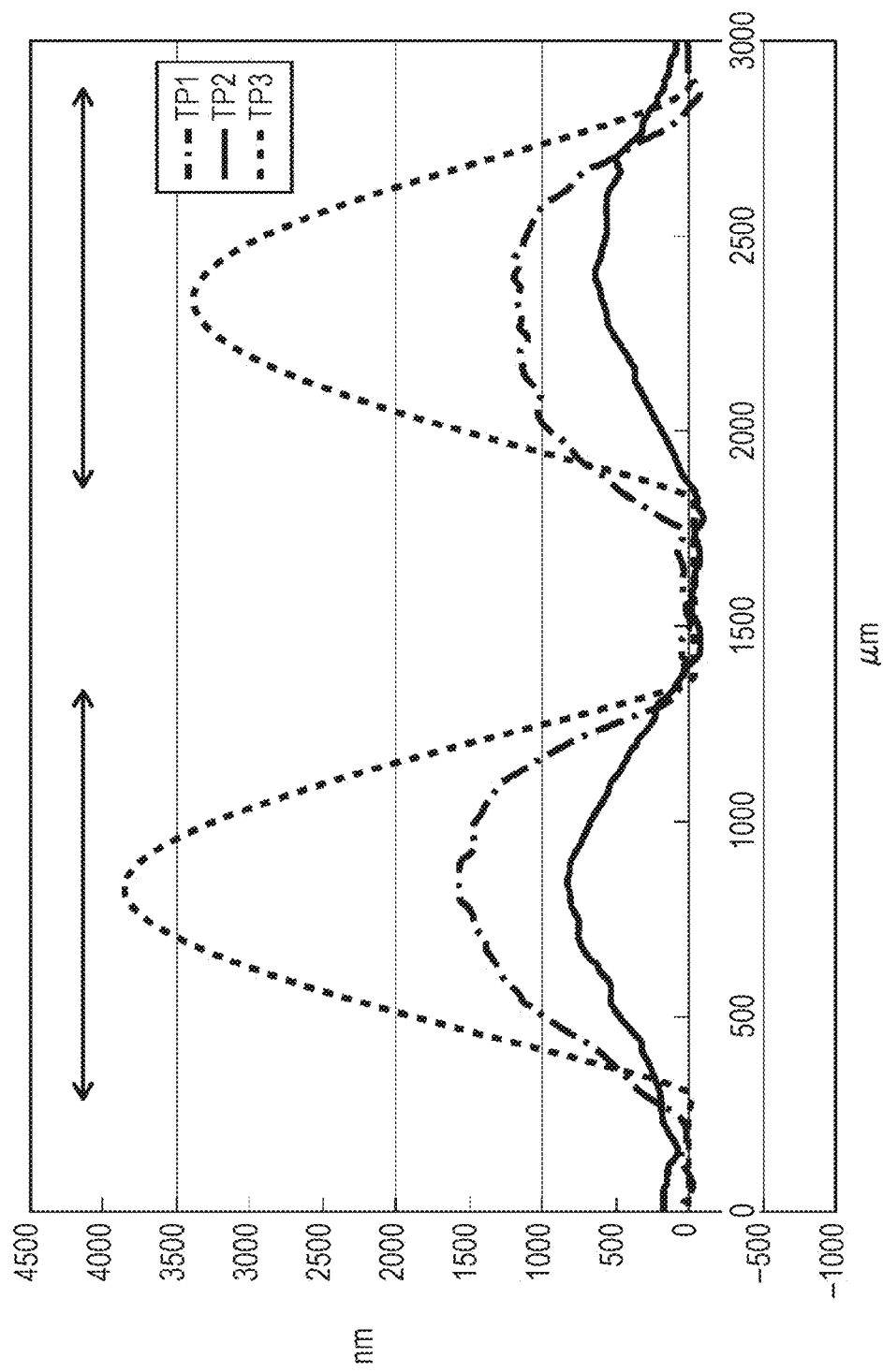
FIG. 24 is a graph of the measurement results of the amounts of displacement of test pieces TP1, TP2, and TP3 after laser irradiation.

FIG. 24 illustrates the results of measurement of the amounts of displacement in the thickness direction of the surfaces of the electrode layers 351 of test pieces TP1, TP2, and TP3 illustrated in FIGS. 23A, 23B, and 23C, the measurement being performed with a stylus profilometer after the laser irradiation. In FIG. 24, regions indicated by arrows correspond to regions that have been irradiated with laser light.

As illustrated in FIGS. 23A, 23B, 23C, and 24, in test piece TP3, the separation of the electrode layer 351 was clearly observed. It was confirmed that the plastic substrate 330 was lifted by a gas generated by an ablation phenomenon due to the laser irradiation to cause a significant deformation of the electrode layer 351. In each of test pieces TP1 and TP2, the amount of displacement of the electrode layer 351 was small, compared with test pieces TP3. In test piece TP2, the amount of displacement of the electrode layer 351 was smaller than that of test piece TP1. As illustrated in FIG. 24, in test piece TP3, the amount of displacement of the electrode layer 351 was about 4 μm. In contrast, in test piece TP1, the amount of displacement of the electrode layer 351 was about 1.5 μm or less. In test piece TP2, the amount of displacement of the electrode layer 351 was about 1 μm or less.

Second, when a comparison is made at an energy density of 160 mJ/cm$^2$, for each of test pieces TP1 and TP2, the number of repetitions of laser irradiation until the separation can be performed is very small, compared with test piece TP3. A possible reason for this is as follows: The porous layer 320 has high porosity and thus a small area that maintains adhesion, thereby facilitating separation even by a single laser irradiation.

Owing to these two effects, the irradiation conditions at a high energy density can be used, thus reducing the number of repetitions of laser irradiation. Even when the entire surface of a large-sized substrate is processed, the time required for the separation treatment of the supporting substrate can be reduced, which is particularly advantageous for production.

Specifically, it is desirable that the average diameter of the pores in the porous layer 320 adjacent to the plastic substrate 330 be, for example, 10 nm or more and 1 μm or less. It is desirable that the average diameter of the pores in the porous layer 320 adjacent to the supporting substrate 310 be, for example, 100 nm or more and 10 μm or less.

Modifications

While the present disclosure has been described on the basis of the embodiment, the present disclosure is not limited to the foregoing embodiment. The following modifications may be performed.

First Modification

In the foregoing embodiment, the porous layer 320 includes the coating thin layer portion 322. However, the porous layer 320 is not limited thereto. The porous layer 320 may have a structure free from the coating thin layer portion 322.

In this case, the average diameter of the pores in a portion of the porous layer 320 adjacent to the plastic substrate 330 is desirably smaller than the average diameter of the pores in a portion of the porous layer 320 adjacent to the supporting substrate. In the case of a smaller average diameter of the portion of the porous layer 320 adjacent to the plastic substrate 330, a resin material that has been applied upon forming the plastic substrate 330 is less likely to enter the pores. Thus, the porosity of the porous layer 320 is maintained, thereby maintaining the effect of relieving the pressure of a gas generated by ablation.

The porous layer 320 is formed by applying a resin material and then heating the applied resin material. In general, bubbles of a solvent disappear more easily at a position closer to a surface. Thus, the pores closer to the surface have a smaller average diameter. The heating temperature, the heating time, and the type and amount of the solvent in the resin material at the time of the formation of the porous layer 320 may be adjusted in such a manner that the coating thin layer portion 322 is not formed.

Second Modification

Figure 25A:
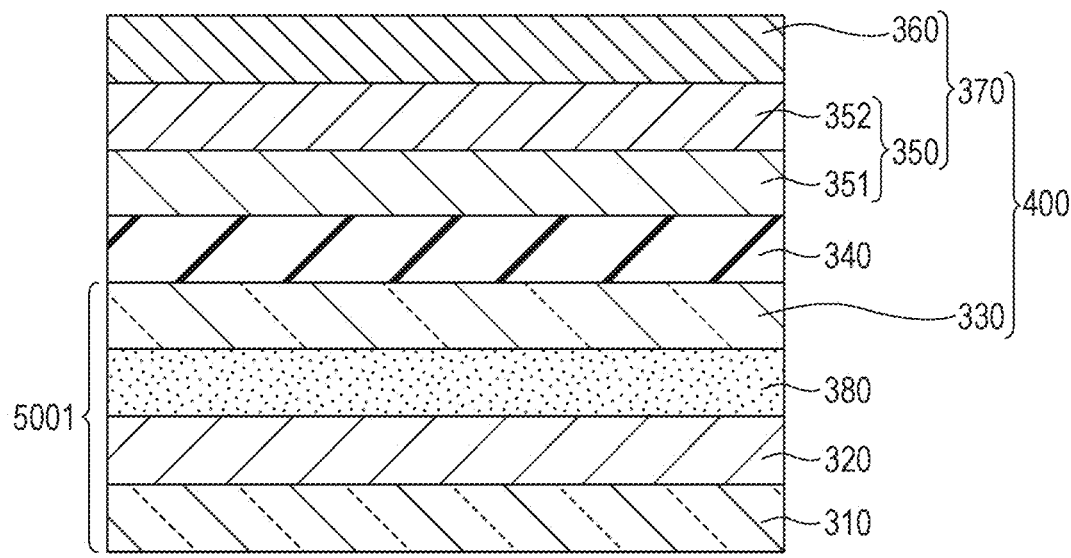
FIG. 25A is a partial cross-sectional view schematically illustrating a state in which an electronic device according to a first modification of the embodiment is arranged on a supporting substrate.

In the case where the plastic substrate 330 is bonded to the porous layer 320, as illustrated in FIG. 25A which illustrates an electron device body 5000 according to a second modification, an adhesive layer 380 may be provided between the porous layer 320 and the plastic substrate 330. The adhesive layer 380 is typically formed by application. Thus, when the pores in a surface portion of the porous layer 320 on the side on which the plastic substrate 330 is formed have a smaller average diameter, a material constituting the adhesive layer is less likely to penetrate into the pores. Also in the case of the bonding, when the pores in the surface portion of the porous layer 320 on the side on which the plastic substrate 330 is formed have a smaller average diameter, a larger area of a surface of the porous layer 320 in close contact with the plastic substrate 330 is provided, compared with the case of a large average diameter, thereby increasing the adhesion to the plastic substrate 330. This prevents accidental detachment of the plastic substrate 330 from the porous layer 320 in the course of the production process of the electronic device.

The supporting substrate 310, the porous layer 320, the adhesive layer 380, and the plastic substrate 330 constitute a laminated substrate 5001 according to the second modification.

Third Embodiment

Figure 25B:
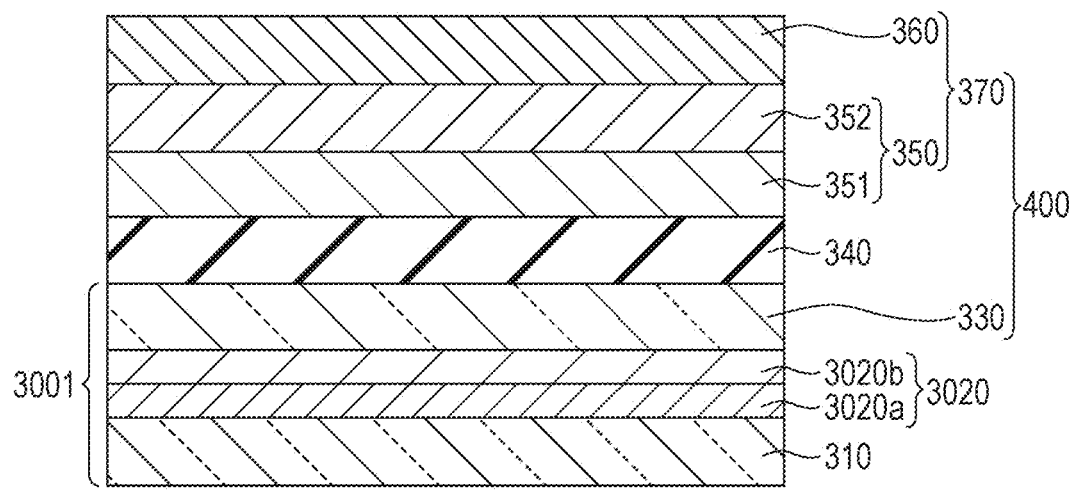
FIG. 25B is a partial cross-sectional view schematically illustrating a state in which an electronic device according to a second modification of the embodiment is arranged on a supporting substrate.

The porous layer may include two or more sublayers. FIG. 25B is a partial cross-sectional view of an electron device body 3000 according to a third modification. As illustrated in FIG. 25B, in the electron device body 3000, a porous layer 3020 includes a first porous sublayer 3020a on the supporting substrate 310, and a second porous sublayer 3020b on the first porous sublayer 3020a. In this case, the average diameter of pores in the second porous sublayer 3020b is desirably smaller than the average diameter of pores in the first porous sublayer 3020a. In the case where the plastic substrate 330 is formed by application on the second porous sublayer 3020b, when the pores in the second porous sublayer 3020b have a smaller average diameter, a resin material is less likely to enter the pores, thereby maintaining the porosity of the second porous sublayer 3020b. This relieves the pressure of a gas generated by ablation due to laser irradiation to suppress the deformation of the plastic substrate, thereby suppressing damage to the device.

Even in the case where the porous layer 320 is formed of a single layer or multiple sublayers, desirably, the pores in a portion having a thickness of at least ½ or more of the thickness of the porous layer 320 are not filled with the resin material for the plastic substrate 330.

Furthermore, an additional layer(s) may be arranged between the supporting substrate 310 and the first porous sublayer 3020a and/or between the first porous sublayer 3020a and the second porous sublayer 3020b.

The supporting substrate 310, the porous layer 3020, and the plastic substrate 330 constitute a laminated substrate 3001 according to the third modification.

Fourth Modification

In the case where the porous layer 3020 includes the first porous sublayer 3020a and the second porous sublayer 3020b like third modification, the second porous sublayer 3020b may be formed by any one of dry processes selected from a chemical vapor deposition method, a sputtering method, and an evaporation method. When the second porous sublayer 3020b is formed by a wet process, water and a solvent are left in the pores and a solid portion of the second porous sublayer 3020b. This causes the generation of a gas by heating and laser irradiation in the subsequent production process. In the case where the second porous sublayer 3020b is formed by a dry process or thermal evaporation, water and a solvent are not left, thereby inhibiting the generation of a gas.

Fifth Modification

A second resin material used to form the second porous sublayer 3020b desirably has a higher viscosity than that of a first resin material used to form the first porous sublayer 3020a. In this case, the second resin material used to form the second porous sublayer 3020b is less likely to enter the pores in the first porous sublayer 3020a, thereby maintaining the porosity of the first porous sublayer 3020a.

Sixth Modification

Affinity treatment may be performed after a step of forming the porous layer 320 and before a step of forming the plastic substrate 330. The affinity treatment may be performed such that the affinity of a surface 323 of the porous layer 320 (i.e. a main surface of the porous layer 320 on the side on which the plastic substrate 330 is to be formed) for the resin material used to form the plastic substrate 330 (hereinafter, referred to simply as "resin affinity") is higher than the resin affinity of inner surfaces 321c of pores 321 exposed at the surface 323.

A method of the affinity treatment will be described below with reference to FIGS. 26A to 27C.

Figure 26A:
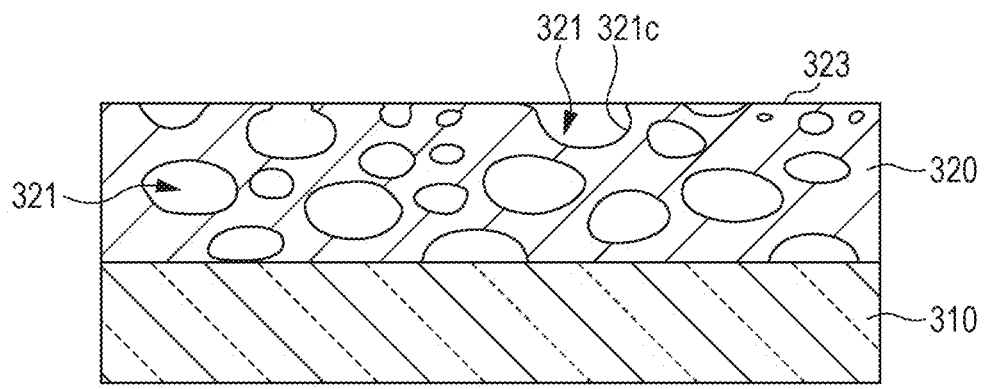
FIGS. 26A and 26B are partial cross-sectional views schematically illustrating some steps in a procedure for producing an electronic device according to a sixth modification of the embodiment.

FIG. 26A is a partial cross-sectional view illustrating a state in which the porous layer 320 is formed on the supporting substrate 310. As illustrated in the figure, the inner surfaces 321c of some pores 321 are exposed at the surface 323 of the porous layer 320.

Figure 26B:
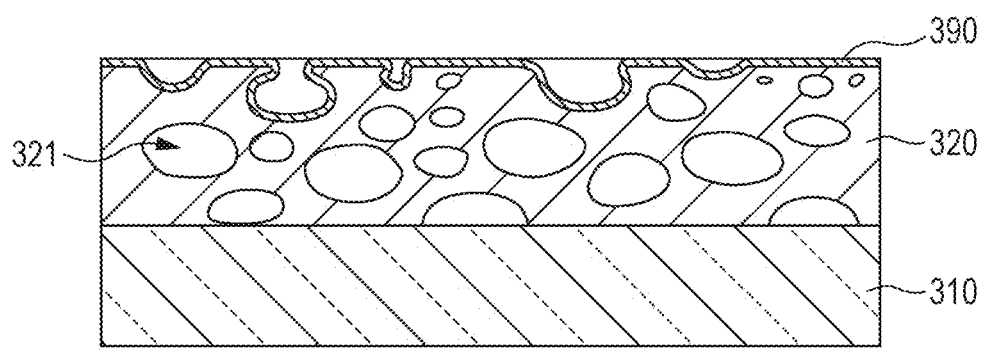

As illustrated in FIG. 26B, a thin film 390 having a low resin affinity is formed on the surface 323 and the inner surfaces 321c. The thin film 390 may be formed by, for example, applying a solution containing a material having a low resin affinity to the surface 323 and the inner surfaces 321c and then performing drying.

Figure 27A:
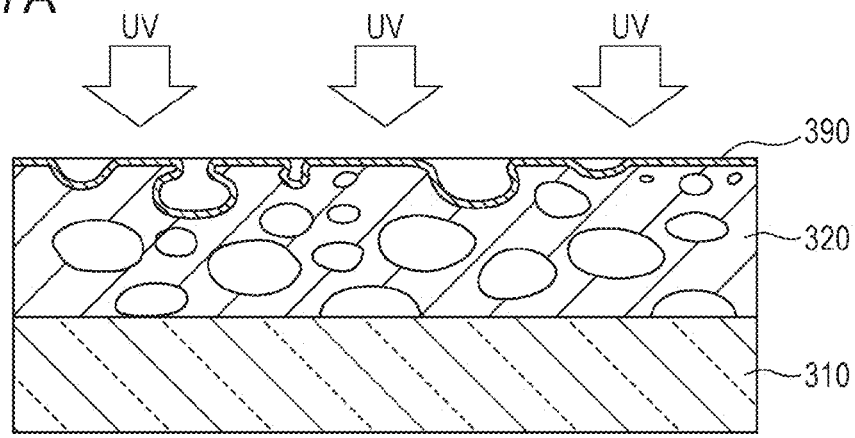
FIGS. 27A to 27C are partial cross-sectional views schematically illustrating some steps in the procedure for producing the electronic device according to the sixth modification of the embodiment continued from FIG. 26B.
Figure 27B:
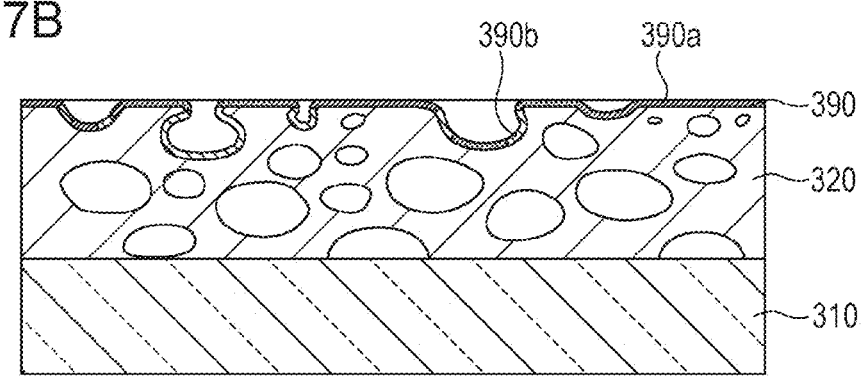

As illustrated in FIG. 27A, the thin film 390 is irradiated with UV light. Thereby, as illustrated in FIG. 27B, a portion of the thin film 390 formed on the surface 323 of the porous layer 320, portions of the thin film 390 formed on shallow portions of the inner surfaces 321c of the pores 321, and portions of the thin film 390 formed on regions corresponding to bottoms of wide openings are exposed to the UV light to increase the resin affinity, resulting in high-resin-affinity portions 390a. A sufficient amount of UV light does not reach portions of the thin film 390 formed on deep portions of the inner surfaces 321c of the pores 321 and inclined portions of the thin film 390 substantially parallel to the irradiation direction of the UV light and being formed near openings. Thus, these portions are not exposed to the UV light. The resin affinity of these portions is maintained at a low level, providing low-resin-affinity portions 390b.

In this modification, the thin film 390 is included in the porous layer 320. The portions of the thin film 390 exposed to the UV light are included in the surface 323 of the porous layer 320. The portions of the thin film 390 not exposed to the UV light are included in the inner surfaces 321c of the pores 321 in the porous layer 320.

Figure 27C:
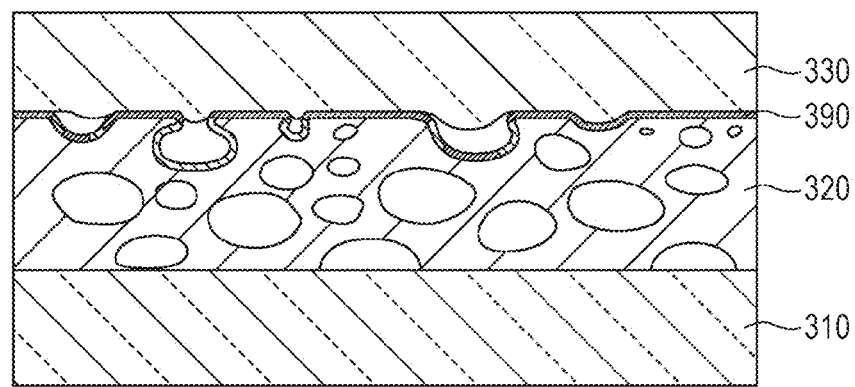

As illustrated in FIG. 27C, the resin material is applied to the thin film 390 to form the plastic substrate 330. At this time, the low-resin-affinity portions 390b are present in the inner surfaces 321c of the pores 321. Thus, the resin material is less likely to enter the pores, thereby maintaining the porosity in the portion of the porous layer 320 in the vicinity of the surface.

The high-resin-affinity portions 390a is formed on the surface 323, resulting in high adhesion between the porous layer 320 and the plastic substrate 330. This prevents accidental detachment of the plastic substrate 330 from the porous layer 320 in the subsequent steps in the production process of the electronic device.

While UV light is used for the resin affinity treatment as described above, the affinity treatment is not limited thereto. The affinity treatment may be performed by irradiation with light (visible light) or plasma treatment in place of irradiation with UV light, depending on the type of the thin film 390.

Seventh Modification

The average diameter of the pores in a portion of the porous layer 320 adjacent to the plastic substrate 330 may be larger than the average diameter of the pores in a portion of the porous layer 320 adjacent to the supporting substrate 310. In this case, a resin material used to form the plastic substrate 330 easily enters the pores. However, the portion of the porous layer 320 near the plastic substrate 330 has low stiffness and thus has the advantage of being more likely to absorb stress caused by a high-pressure gas generated at the time of laser irradiation.

While the display panel devices and the methods for producing the same according to embodiments of the present disclosure have been described on the basis of the embodiments and the modifications (hereinafter, referred to as "embodiments and so forth"), the present disclosure is not limited to the foregoing embodiments and so forth. The first embodiment, the second embodiment, and the modifications thereof may be appropriately combined together. The present disclosure includes structures obtained by subjecting the embodiments and so forth to changes conceived by a person skilled in the art and structures achieved by any combinations of elements and functions in the embodiments without departing from the scope of the present disclosure.

In the embodiments and the modifications, the structures in which the laminated substrates are used in the display devices have been described. The structures are illustrative but not restrictive in all aspects. For example, even when the laminated substrates are used for electronic devices except display devices, in particular, light-emitting devices that emit light from at least part thereof (lighting systems, electronic advertisements, and so forth), it is possible to suppress the reflection of extraneous light. While the display devices include display device elements in the foregoing embodiments, in the case of light-emitting devices, display device elements may be replaced with light-emitting elements.

A flexible display produced by the present disclosure is applicable to elaborate displays that can be fitted to curved surfaces, for example, television sets, mobile terminals, such as tablet computers and smartphones, watch-type wearable terminals, and automotive interiors.

What is claimed is:

1. A light-emitting device comprising:
a transparent substrate having a first surface and a second surface opposite to the first surface;
a light-emitting element and a thin film transistor provided on the first surface of the transparent substrate, the light emitting element being configured to emit light;
a porous layer on the second surface of the transparent substrate, the porous layer including an organic material and having pores; and
a first layer between the transparent substrate and the porous layer,
wherein the light-emitting element has a third surface and a fourth surface opposite to the third surface, the third surface facing the first surface of the transparent substrate,
the light is emitted from the fourth surface of the light emitting element to outside of the light-emitting device, and
the first layer is thinner than the transparent substrate.

2. The light-emitting device according to claim 1, wherein the pores in the porous layer include a first pore and a second pore that is larger than the first pore.

3. The light-emitting device according to claim 2, wherein a diameter of the second pore is at least ten times larger than a diameter of the first pore.

4. The light-emitting device according to claim 1, wherein the porous layer has a uniform thickness.

5. The light-emitting device according to claim 1, wherein the porous layer has a thickness of 1 µm or more and 1000 µm or less.

6. The light-emitting device according to claim 1, wherein the thin film transistor includes a gate.

7. The light-emitting device according to claim 1, wherein the thin film transistor is located between the light-emitting element and the transparent substrate.

8. The light-emitting device according to claim 6, wherein the thin film transistor is located between the light-emitting element and the transparent substrate.

9. The light-emitting device according to claim 1, wherein the light-emitting element and the thin film transistor are provided indirectly on the first surface of the transparent substrate.

10. A light-emitting device comprising:
    a transparent substrate having a first surface and a second surface opposite to the first surface;
    a light-emitting element and a thin film transistor provided on the first surface of the transparent substrate, the light emitting element being configured to emit light;
    a porous layer on the second surface of the transparent substrate, the porous layer including an organic material and having pores; and
    a first layer between the transparent substrate and the porous layer,
    wherein the first layer is thinner than the transparent substrate.

11. The light-emitting device according to claim 10, wherein the thin film transistor includes a gate.

12. The light-emitting device according to claim 10, wherein the thin film transistor is located between the light-emitting element and the transparent substrate.

13. The light-emitting device according to claim 11, wherein the thin film transistor is located between the light-emitting element and the transparent substrate.

14. The light-emitting device according to claim 10, wherein
    the pores in the porous layer include a first pore and a second pore that is larger than the first pore.

15. The light-emitting device according to claim 10, wherein
    the porous layer has a uniform thickness.

16. The light-emitting device according to claim 1, wherein the light-emitting element and the thin film transistor are provided indirectly on the first surface of the transparent substrate.

17. A light-emitting device comprising:
    a transparent substrate having a first surface and a second surface opposite to the first surface;
    a light-emitting element and a thin film transistor provided on the first surface of the transparent substrate, the light emitting element being configured to emit light;
    a porous layer on the second surface of the transparent substrate, the porous layer including an organic material and having pores; and
    a first layer between the transparent substrate and the porous layer,
    wherein the light-emitting element has a third surface and a fourth surface opposite to the third surface, the third surface facing the first surface of the transparent substrate, and
    the light is emitted from the fourth surface of the light emitting element to outside of the light-emitting device.

18. The light-emitting device according to claim 17, wherein the thin film transistor includes a gate.

19. The light-emitting device according to claim 17, wherein the thin film transistor is located between the light-emitting element and the transparent substrate.

20. The light-emitting device according to claim 18, wherein the thin film transistor is located between the light-emitting element and the transparent substrate.

21. The light-emitting device according to claim 17, wherein
    the pores in the porous layer include a first pore and a second pore that is larger than the first pore.

22. The light-emitting device according to claim 17, wherein
    the porous layer has a uniform thickness.

23. The light-emitting device according to claim 10, wherein the light-emitting element and the thin film transistor are provided indirectly on the first surface of the transparent substrate.

* * * * *